United States Patent
Matus et al.

(10) Patent No.: US 9,051,175 B2
(45) Date of Patent: Jun. 9, 2015

(54) BULK NANO-RIBBON AND/OR NANO-POROUS STRUCTURES FOR THERMOELECTRIC DEVICES AND METHODS FOR MAKING THE SAME

(71) Applicant: Alphabet Energy, Inc., Hayward, CA (US)

(72) Inventors: Gabriel A. Matus, San Francisco, CA (US); Matthew L. Scullin, San Francisco, CA (US)

(73) Assignee: Alphabet Energy, Inc., Hayward, CA (US)

( * ) Notice: Subject to any disclaimer, the term of this patent is extended or adjusted under 35 U.S.C. 154(b) by 0 days.

(21) Appl. No.: 13/786,090

(22) Filed: Mar. 5, 2013

(65) Prior Publication Data

US 2013/0187130 A1 Jul. 25, 2013

Related U.S. Application Data

(60) Provisional application No. 61/607,739, filed on Mar. 7, 2012.

(51) Int. Cl.
| | |
|---|---|
| *H01L 29/40* | (2006.01) |
| *B81C 1/00* | (2006.01) |

(Continued)

(52) U.S. Cl.
CPC ........ *B81C 1/00539* (2013.01); *H01L 29/0665* (2013.01); *H01L 21/308* (2013.01);

(Continued)

(58) Field of Classification Search
CPC ............ H01L 51/0048; H01L 51/0545; H01L 2924/00; H01L 29/0665; H01L 29/0673; H01L 29/068; H01L 29/78696; H01L 33/20; H01L 2924/1306; H01L 2924/13091; H01L 27/1292; H01L 51/0504; H01L 51/05
USPC ............ 257/784, E29.07, E23.112, E23.024; 977/762, 766, 768, 938
See application file for complete search history.

(56) References Cited

U.S. PATENT DOCUMENTS

| | | |
|---|---|---|
| 2,588,254 A | 3/1952 | Lark-Horovitz et al. |
| 3,441,812 A | 4/1969 | De Bucs et al. |

(Continued)

FOREIGN PATENT DOCUMENTS

| | | |
|---|---|---|
| CN | 101009214 | 8/2007 |
| EP | 0687020 | 12/1995 |

(Continued)

OTHER PUBLICATIONS

Kolasinski, Kurt W., "Silicon Nanostructures from Electroless Electrochemical Etching," Current Opinion in Solid State and Materials Science, 9(1-2), (2005), pp. 73-83.

(Continued)

*Primary Examiner* — Mark A Laurenzi
(74) *Attorney, Agent, or Firm* — Jones Day

(57) ABSTRACT

Structure including nano-ribbons and method thereof. The structure include multiple nano-ribbons. Each of the multiple nano-ribbons corresponds to a first end and a second end, and the first end and the second end are separated by a first distance of at least 100 μm. Each of the multiple nano-ribbons corresponds to a cross-sectional area associated with a ribbon thickness, and the ribbon thickness ranges from 5 nm to 500 nm. Each of the multiple nano-ribbons is separated from at least another nano-ribbon selected from the multiple nano-ribbons by a second distance ranging from 5 nm to 500 nm.

44 Claims, 11 Drawing Sheets

(51) Int. Cl.
  *H01L 29/06* (2006.01)
  *H01L 21/308* (2006.01)
  *H01L 21/306* (2006.01)
  *H01L 35/32* (2006.01)
  *H01L 35/34* (2006.01)
  *B82Y 10/00* (2011.01)
  *H01L 29/66* (2006.01)

(52) U.S. Cl.
  CPC .... *H01L21/30604* (2013.01); *H01L 21/30608* (2013.01); *H01L 21/3085* (2013.01); *H01L 35/32* (2013.01); *H01L 35/34* (2013.01); *B82Y 10/00* (2013.01); *H01L 29/66439* (2013.01); *H01L 29/0673* (2013.01)

(56) References Cited

U.S. PATENT DOCUMENTS

| | | | |
|---|---|---|---|
| 4,251,286 A | 2/1981 | Barnett | |
| 4,493,939 A | 1/1985 | Blaske et al. | |
| 5,391,914 A | 2/1995 | Sullivan et al. | |
| 5,824,561 A | 10/1998 | Kishi et al. | |
| 5,837,929 A | 11/1998 | Adelman | |
| 5,950,067 A | 9/1999 | Maegawa et al. | |
| 6,300,150 B1 | 10/2001 | Venkatasubramanian | |
| 6,843,902 B1 | 1/2005 | Penner et al. | |
| 6,882,051 B2 | 4/2005 | Majumdar et al. | |
| 6,894,215 B2 | 5/2005 | Akiba | |
| 6,996,147 B2 | 2/2006 | Majumdar et al. | |
| 7,267,859 B1 | 9/2007 | Rabin et al. | |
| 7,361,313 B2 | 4/2008 | Chan et al. | |
| 7,569,202 B2 | 8/2009 | Farrell et al. | |
| 7,605,327 B2 | 10/2009 | Roscheisen et al. | |
| 7,820,292 B2 | 10/2010 | Shcherbakov et al. | |
| 8,044,294 B2 | 10/2011 | Park et al. | |
| 8,729,381 B2 | 5/2014 | Yang et al. | |
| 8,736,011 B2 | 5/2014 | Yi et al. | |
| 2002/0175408 A1 | 11/2002 | Majumdar et al. | |
| 2003/0041892 A1 | 3/2003 | Fleurial et al. | |
| 2003/0099279 A1 | 5/2003 | Venkatasubramanian et al. | |
| 2003/0184188 A1 | 10/2003 | Kucherov et al. | |
| 2003/0189202 A1 | 10/2003 | Li et al. | |
| 2004/0000333 A1 | 1/2004 | Chen et al. | |
| 2004/0042181 A1 | 3/2004 | Nagasaki | |
| 2004/0106203 A1 | 6/2004 | Stasiak et al. | |
| 2004/0157354 A1 | 8/2004 | Kuriyama et al. | |
| 2004/0161369 A1 | 8/2004 | Chan et al. | |
| 2004/0251539 A1 | 12/2004 | Faris et al. | |
| 2004/0261830 A1 | 12/2004 | Sharp et al. | |
| 2005/0045702 A1 | 3/2005 | Freeman et al. | |
| 2005/0064185 A1 | 3/2005 | Buretea et al. | |
| 2005/0110064 A1 | 5/2005 | Duan et al. | |
| 2005/0112872 A1 | 5/2005 | Okamura | |
| 2005/0224790 A1 | 10/2005 | Jin et al. | |
| 2005/0241690 A1 | 11/2005 | Tajima et al. | |
| 2006/0000502 A1 | 1/2006 | Fiorini et al. | |
| 2006/0076046 A1 | 4/2006 | Ghoshal et al. | |
| 2006/0118158 A1 | 6/2006 | Zhang et al. | |
| 2006/0118513 A1 | 6/2006 | Faure et al. | |
| 2006/0151820 A1 | 7/2006 | Duan et al. | |
| 2006/0157101 A1 | 7/2006 | Sakamoto et al. | |
| 2006/0159916 A1 | 7/2006 | Dubrow et al. | |
| 2006/0172116 A1 | 8/2006 | Den et al. | |
| 2006/0233692 A1 | 10/2006 | Scaringe et al. | |
| 2006/0251561 A1 | 11/2006 | Farrell et al. | |
| 2006/0266402 A1 | 11/2006 | Zhang et al. | |
| 2007/0025658 A1 | 2/2007 | Fukai et al. | |
| 2007/0128773 A1 | 6/2007 | Baskaran | |
| 2007/0131269 A1 | 6/2007 | Dutta | |
| 2007/0132043 A1 | 6/2007 | Bradley et al. | |
| 2007/0261730 A1 | 11/2007 | Seker et al. | |
| 2008/0006843 A1 | 1/2008 | Dai et al. | |
| 2008/0060695 A1 | 3/2008 | Brignone | |
| 2008/0121263 A1 | 5/2008 | Schutte et al. | |
| 2008/0142066 A1 | 6/2008 | Plissonnier et al. | |
| 2008/0149914 A1 | 6/2008 | Samuelson et al. | |
| 2008/0173344 A1 | 7/2008 | Zhang et al. | |
| 2008/0178920 A1 | 7/2008 | Ullo | |
| 2008/0178921 A1 | 7/2008 | Ye | |
| 2008/0230802 A1 | 9/2008 | Bakkers et al. | |
| 2008/0268233 A1 | 10/2008 | Lawin et al. | |
| 2008/0299381 A1 | 12/2008 | Zhang et al. | |
| 2008/0308140 A1 | 12/2008 | Nakamura | |
| 2009/0004086 A1 | 1/2009 | Kuhling et al. | |
| 2009/0020148 A1 | 1/2009 | Boukai et al. | |
| 2009/0096109 A1 | 4/2009 | Iwasaki | |
| 2009/0117741 A1 | 5/2009 | Heath et al. | |
| 2009/0140145 A1 | 6/2009 | Ouvrier-Buffet et al. | |
| 2009/0174038 A1 | 7/2009 | Wang | |
| 2009/0214848 A1 | 8/2009 | Sands | |
| 2009/0236317 A1 | 9/2009 | Yost et al. | |
| 2010/0068871 A1 | 3/2010 | Tian et al. | |
| 2010/0072461 A1 | 3/2010 | Hannebauer | |
| 2010/0078055 A1 | 4/2010 | Vidu et al. | |
| 2010/0147371 A1 | 6/2010 | Cho | |
| 2010/0162728 A1 | 7/2010 | Lee | |
| 2010/0233518 A1 | 9/2010 | Kwon et al. | |
| 2010/0236596 A1 | 9/2010 | Lee et al. | |
| 2010/0261013 A1 | 10/2010 | Duan et al. | |
| 2010/0272993 A1 | 10/2010 | Volinsky et al. | |
| 2010/0319759 A1 | 12/2010 | Fisher et al. | |
| 2011/0000708 A1 | 1/2011 | Nakai et al. | |
| 2011/0059568 A1 | 3/2011 | Chao et al. | |
| 2011/0065223 A1 | 3/2011 | Hannebauer | |
| 2011/0114145 A1 | 5/2011 | Yang et al. | |
| 2011/0114146 A1 | 5/2011 | Scullin | |
| 2011/0233512 A1 | 9/2011 | Yang et al. | |
| 2011/0266521 A1 | 11/2011 | Ferrari et al. | |
| 2011/0304004 A1 | 12/2011 | Park | |
| 2012/0049315 A1 | 3/2012 | Kim et al. | |
| 2012/0152295 A1 | 6/2012 | Matus et al. | |
| 2012/0247527 A1 | 10/2012 | Scullin et al. | |
| 2012/0282435 A1 | 11/2012 | Yang et al. | |
| 2012/0295074 A1 | 11/2012 | Yi et al. | |
| 2012/0319082 A1 | 12/2012 | Yi et al. | |
| 2013/0000688 A1 | 1/2013 | Cho et al. | |
| 2013/0019918 A1 | 1/2013 | Boukai et al. | |
| 2013/0037070 A1 | 2/2013 | Narducci et al. | |
| 2013/0042899 A1 | 2/2013 | Wirtz et al. | |
| 2013/0069194 A1 | 3/2013 | Marinescu et al. | |
| 2013/0081662 A1 | 4/2013 | Dibra | |
| 2013/0161834 A1 | 6/2013 | Pan | |
| 2013/0175654 A1 | 7/2013 | Muckenhirn et al. | |
| 2013/0186445 A1 | 7/2013 | Lorimer et al. | |
| 2013/0241026 A1 | 9/2013 | Or-Bach et al. | |
| 2013/0267046 A1 | 10/2013 | Or-Bach et al. | |
| 2014/0024163 A1 | 1/2014 | Aguirre et al. | |
| 2014/0116491 A1 | 5/2014 | Reifenberg et al. | |
| 2014/0182644 A1 | 7/2014 | Aguirre et al. | |
| 2014/0193982 A1 | 7/2014 | Yi et al. | |
| 2014/0318593 A1 | 10/2014 | Venkatasubramanian et al. | |
| 2014/0329389 A1 | 11/2014 | Matus et al. | |

FOREIGN PATENT DOCUMENTS

| | | |
|---|---|---|
| EP | 1426756 | 6/2004 |
| JP | 2004-532133 | 10/2004 |
| JP | 2006-332188 | 12/2006 |
| JP | 5524839 | 4/2014 |
| RU | 2296055 | 11/2006 |
| WO | WO 00/08693 | 2/2000 |
| WO | WO 02/080280 | 10/2002 |
| WO | WO 2006/062582 | 6/2006 |
| WO | WO 2009/026466 | 2/2009 |
| WO | WO 2010/004550 | 1/2010 |
| WO | WO 2010/018893 | 2/2010 |

OTHER PUBLICATIONS

United States Patent and Trademark Office, Office Action issued in U.S. Appl. No. 13/430,558, mailed Apr. 24, 2014.

United States Patent and Trademark Office, Corrected Notice of Allowability issued in U.S. Appl. No. 13/308,945, mailed Apr. 24, 2014.

(56) References Cited

OTHER PUBLICATIONS

United States Patent and Trademark Office, Final Office Action issued in U.S. Appl. No. 13/364,176, mailed Sep. 8, 2014.
United States Patent and Trademark Office, Office Action issued in U.S. Appl. No. 14/203,360, mailed Jun. 10, 2014.
Asheghi et al., "Phonon-Boundary Scattering in Thin Silicon Layers," *Appl. Phys. Lett.*, 71(13) (1997), 1798-1800.
Asheghi et al., "Temperature-Dependent Thermal Conductivity of Single Crystal Silicon Layers in SOI Substrates," *J. Heat Transf.*, 120 (1998), pp. 30-36.
Brinson et al., "Thermal Conductivity and Thermoelectric Power of Heavily Doped N-Type Silicon," *J. Phys. C*, 3 (1970), pp. 483-491.
Cahill et al., "Thermal Conductivity of Amorphous Solids Above the Plateau," *Phys. Rev. B*, 35 (1987) pp. 4067-4073.
Chartier et al., "Metal-Assisted Chemical Etching of Silcon in $HF-H_2O_2$," *Electrochmica Acta*, 53 (2008) pp. 5509-5516.
Chen et al., "Thermal Conductance of Thin Silicon Nanowires," *Physical Review Letters*, 101 (2008) pp. 105501-1-105501-4.
Chen et al., "Vertically-Aligned of Sub-Millimeter Ultralong Si Nanowire Arrays and Its Reduced Phonon Thermal Conductivity," *Journal of the Electrochemical Society*, 158:5 (2011) pp. D302-D306.
Chinese Patent Office, Office Action in CN Application No. 200880113050.3, mailed Aug. 26, 2013.
Chinese Patent Office, Office Action in CN Application No. 200880113050.3, mailed Mar. 5, 2013.
Chinese Patent Office, Office Action in CN Application No. 200880113050.3, mailed Oct. 24, 2011.
Chinese Patent Office, Office Action in CN Application No. 200880113050.3, mailed Sep. 5, 2012.
Disalvo, F.J., "Thermoelectric Cooling and Power Generation," *Science*, 285 (1999), 703-706.
Douani et al., "Formation of a-Si:H and $a-Si_{1-x}C_x$:H Nanowires by Ag-Assisted Electroless Etching in Aqueous $HF/AgNO_3$ Solution," *Thin Solid Films*, 519 (2011) pp. 5383-5387.
Electron Microscopy Sciences, Colloidal Compounds and Conductive Adhesives, Jan. 25, 2011; Retrieved on Aug. 13, 2012 from the Internet <URL: http://web.archive.org/web/20110125172854/http://emsdiasum.com/microscopy/products/sem/colloidal.aspx>. pp. 1-16.
Engineering Toolbox, "Thermal Conductivity of Metals," Engineering ToolBox.com [retrieved online on Jan. 22, 2014], from the Internet <URL: http://www.engineeringtoolbox.com/thermal-conductivity-metals-d_858.html>, pp. 1-8.
European Patent Office, Extended European Search Report for EP Application No. 10163141, mailed Aug. 20, 2013.
European Patent Office, Supplemental Search Report for EP Application No. 08827590, mailed Aug. 5, 2013.
Evanoff et al., "Synthesis and Optical Properties of Silver Nanoparticles and Arrays," *ChemPhysChem*, 6 (2005) pp. 1221-1231.
Fang et al., "Silver Catalysis in the Fabrication of Silicon Nanowire Arrays," *Nanotechnology*, 17 (2006) pp. 3768-3774.
Gao et al., "Selective Growth of Si Nanowire Arrays via Galvanic Displacement Processes in Water-in-Oil Microemulsions," *J. Am. Chem. Soc.*, 127 (2005) pp. 4574-4575.
Geballe et al., "Seebeck Effect in Silicon," *Phys. Rev.*, 98(4) (1955), pp. 940-947.
Gielis et al., "Silver-Assisted Electroless Etching of Si Nanowires," *Abstract #1971*, presented Oct. 11, 2010 at the 218th ECS Meeting (held in Las Vegas, NV, Oct. 10-15, 2010).
Harman et al., "Quantum Dot Superlattice Thermoelectric Materials and Evices," *Science*, 297 (2002), pp. 2229-2232.
Heitscii et al., *J. Am. Chem. Soc.*, 130 (2008) pp. 5436-5437.
Hochbaum et al., "Controlled Growth of Si Nanowire Arrays for Device Integration," *Nano Letters*, 5(3) (2005) pp. 457-460.
Hochbaum et al., "Enhanced Thermoelectric Performance of Rough Silicon Nanowires," Nature, 451 (2008) pp. 163-167 (with full Methods attached from on-line version of this paper at www.nature.com/nature).

Hochbaum et al., "Single Crystalline Mesoporous Silicon Nanowires," *Nano Letters*, 9(10) (2009) pp. 3550-3554.
Hsu et al., "Cubic $AgPb_mSbTe_{2+m}$: Bulk Thermoelectric Materials with High Figure of Merit," *Science*, 303 (2004), pp. 818-821.
Infineon, "Introduction to Power Dissipation and Thermal Resistance," Infineon.com [retrieved online on Jan. 22, 2014], from the Internet <URL: http://www.btipnow.com/events/ppt/Ch4%20Intro%20Power%20Diss%20Thermal%20Res.ppt>, pp. 1-67.
Japanese Patent Office, Office Action in JP Application No. 2010-522040, mailed Mar. 5, 2013.
Japanese Patent Office, Office Action in JP Application No. 2010-522040, mailed Oct. 15, 2013.
Ju et al., "Phonon Scattering in Silicon Films with Thickness of Order 100 nm," *Appl. Phys. Lett.*, 74(20) (1999), pp. 3005-3007.
Kim et al., "Thermal Conductivity Reduction and Thermoelectric Figure of Merit Increase by Embedding Nanoparticles in Crystalline Semiconductors," *Phys. Rev. Lett.*, 96 (2006), pp. 045901-1-045901-4.
Li et al., "Thermal Conductivity of Individual Silicon Nanowires," *Appl. Phys. Lett.*, 83(14) (2003), pp. 2934-2936.
Majumdar, A., "Thermoelectricity in Semiconductor Nanostructures," *Science*, 303 (2004), pp. 777-778.
Morinaga et al., "Mechanism of Metallic Particle Growth and Metal-Induced Pitting on Si Wafer Surface in Wet Chemical Process," *J. Electrochem. Soc.*, 141(10) (1994) pp. 2834-2841.
Nahm et al., "Mechanism of Silicon Etching in $HF-KMnO_4-H_2O$ Solution," *Korean J. of Chem. Eng.*, 12(2) (1995) pp. 162-167.
Parkhutik, V.P., "Oscillations of Open-Circuit Potential During Immersion Plating of Silicon in $CuSo_4$/HF Solutions," *Russian Journal of Electrochemistry*, 42(5) (2006) pp. 512-522.
Patent Cooperation Treaty, International Search Report for application PCT/US2010/056356, mailed Jun. 3, 2011.
Patent Cooperation Treaty, International Search Report for application PCT/US2011/061301, mailed Jan. 31, 2013.
Patent Cooperation Treaty, International Search Report for application PCT/US2011/63000, mailed Apr. 3, 2012.
Patent Cooperation Treaty, International Search Report for application PCT/US2011/066108, mailed Apr. 26, 2012.
Patent Cooperation Treaty, International Search Report for application PCT/US2012/023425, mailed Sep. 4, 2012.
Patent Cooperation Treaty, International Search Report for application PCT/US2013/025060, mailed Apr. 15, 2013.
Patent Cooperation Treaty, International Search Report for PCT/US08/73922, mailed Dec. 23, 2008.
Patent Cooperation Treaty, Written Opinion for PCT/US08/73922, mailed Dec. 23, 2008.
Patent Cooperation Treaty, Written Opinion of the International Searching Authority for application PCT/US2010/056356, mailed Jun. 3, 2011.
Patent Cooperation Treaty, Written Opinion of the International Searching Authority for application PCT/US2011/061301, mailed Jan. 31, 2013.
Patent Cooperation Treaty, Written Opinion of the International Searching Authority for application PCT/US2011/63000, mailed Apr. 3, 2012.
Patent Cooperation Treaty, Written Opinion of the International Searching Authority for application PCT/US2011/066108, mailed Apr. 26, 2012.
Patent Cooperation Treaty, Written Opinion of the International Searching Authority for application PCT/US2012/023425, mailed Sep. 4, 2012.
Patent Cooperation Treaty, Written Opinion of the International Searching Authority for application PCT/US2013/025060, mailed Apr. 15, 2013.
Peng et al., "Aligned Single-Crystalline Si Nanowire Arrays for Photovoltaic Applications," *Small*, 1(11), (2005), pp. 1062-1067.
Peng et al., "Aligned Single-Crystalline Si Nanowire Arrays for Photovoltaic Applications," *Small*, 1(11), (2005), pp. 1062-1067, with three additional pages of "Supporting Information."
Peng et al., "Dendrite-Assisted Growth of Silicon Nanowires in Electroless Metal Deposition," *Advanced Functional Materials*, 13(2) (2003) pp. 127-132.

(56) References Cited

OTHER PUBLICATIONS

Peng et al., "Motility of Metal Nanoparticles in Silicon and Induced Anisotropic Silicon Etching," *Advanced Functional Materials*, 18 (2008) pp. 3026-3035.
Peng et al., "Synthesis of Large-Area Silicon Nanowire Arrays via Self-Assembling Nanoelectrochemistry," *Adv. Mater.*, 14(16) (2002) pp. 1164-1167.
Peng et al., "Uniform, Axial-Orientation Alignment of One-Dimensional Single-Crystal Silicon Nanostructure Arrays," *Angew. Chem. Int. Ed*, 44 (2005) pp. 2737-2742.
Rokugawa et al., "An Etchant System, $Ag_2CrO_4$-HF-$H_2O$, for Highly Aligned Si Nanowire Fabrication," *Journal of the Electrochemical Society*, 157(8) (2010), pp. K157-K161.
Ruf et al., "Thermal Conductivity of Isotopically Enriched Silicon," *Solid State Commun.*, 115 (2000), pp. 243-247.
Russian Patent Office, Office Action in RU Application No. 2010110307/04, mailed Jun. 1, 2012.
Russian Patent Office, Resolution on Granting Patent for Invention in RU Application No. 2010110307/04, mailed Sep. 11, 2013.
Rutten et al., "The Electrochemical Reduction of Nitrate in Acidic Nitrate Solutions," *Journal of Applied Electrochemistry*, 29 (1999) pp. 87-92.
Shi et al., "Measuring Thermal and Thermoelectric Properties of One-Dimensional Nanostructures Using a Microfabricated Device," *J. Heat Transf.*, 125 (2003), pp. 881-888.
Sivakov et al., "Realization of Vertical and Zigzag Single Crystalline Silicon Nanowire Architectures," *J. Phys. Chem. C*, 114 (2010) pp. 3798-3803.
Tang et al., "Holey Silicon as an Efficient Thermoelectric Material," *Nano Lett.*, 10 (2010), pp. 4279-4283.
Tao et al., "Langmuir-Blodgett Silver Nanowire Monolayers for Molecular Sensing Using Surface-Enhanced Raman Spectroscopy," *Nano. Lett.* 3, (2003), pp. 1229-1233.
United States Patent and Trademark Office, Advisory Action issued in U.S. Appl. No. 12/673,366, mailed Nov. 27, 2013.
United States Patent and Trademark Office, Notice of Allowance issued in U.S. Appl. No. 13/308,945, mailed Dec. 11, 2013.
United States Patent and Trademark Office, Office Action issued in U.S. Appl. No. 12/673,366, mailed May 1, 2013.
United States Patent and Trademark Office, Office Action issued in U.S. Appl. No. 12/673,366, mailed Sep. 26, 2013.
United States Patent and Trademark Office, Office Action issued in U.S. Appl. No. 12/943,134, mailed Nov. 18, 2013.
United States Patent and Trademark Office, Office Action issued in U.S. Appl. No. 13/308,945, mailed Aug. 2, 2013.
United States Patent and Trademark Office, Office Action issued in U.S. Appl. No. 13/364,176, mailed Jan. 27, 2014.
United States Patent and Trademark Office, Office Action issued in U.S. Appl. No. 13/760,977, mailed Apr. 1, 2014.
Van Herwaarden, A.W., "The Seebeck Effect in Silicon ICs.," *Sensors and Actuators*, 6 (1984), pp. 245-254.
Venkatasubramanian et al., "Thin-film Thermoelectric Devices with High Room-Temperature Figures of Merit," *Nature*, 413 (2001), pp. 597-602.
Wang et al., "Complementary Symmetry Silicon Nanowire Logic: Power-Efficient Inverters with Gain," *Small*, 2(10), (2006), pp. 1153-1158.
Weber et al., "Transport Properties of Silicon," *Appl. Phys. A.* 53, (1991), 136-140.
Weiss et al., "Nanoparticle-Textured Surfaces from Spin Coating," *Langmuir*, 24 (2008) pp. 5218-5220.
Wilson, "Thermal Conductivity of Solders," Electronics-cooling. com [retrieved online on Jan. 23, 2014], from the Internet <URL: http://www.electronics-cooling.com/2006/08/thermal-conductivity-of-solders/>, pp. 1-3.
Yoo et al., "Thermal Conductivity of Al2O3/Water Nanofluids," *Journal of the Korean Physical Society*, 51 (Oct. 2007), pp. S84-S87.
Zandi et al., "Study of Bulk Micromachining for <100> Silicon," *Eur. Phys. J. Appl. Phys.*, 35 (2006) pp. 7-12.

Zhang et al., "Synthesis of Ordered Single Crystal Silicon Nanowire Arrays," *Adv. Mater.*, 13 (2001), 1238.
Zou et al., "Phonon Heat Conduction in a Semiconductor Nanowire," *J. App. Phys.*, 89(5) (2001) pp. 2932-2938.
Kim et al., "Thermal Transport Properties of Thin Films of Small Molecule Organic Semiconductors," Applied Physics Letters, 87: 241908 (2005), 3 pages.
United States Patent and Trademark Office, Office Action issued in U.S. Appl. No. 12/943,134, mailed Jan. 21, 2015.
United States Patent and Trademark Office, Office Action issued in U.S. Appl. No. 13/331,768, mailed Jan. 20, 2015.
Cheng et al., "Fabrication of Vertically Aligned Silicon Nanowire Arrays and Investigation on the Formation of the Nickel Silicide Nanowires," presented at the 2007 IEEE Conference on Electron Devices and Solid-State Circuit held Dec. 20-22, 2007, IEEE Service Center, 2007, pp. 121-124.
European Patent Office, Extended European Search Report for EP Application No. 11841453.1, mailed Nov. 28, 2014.
European Patent Office, Extended European Search Report for EP Application No. 11845164.0, mailed Nov. 6, 2014.
United States Patent and Trademark Office, Notice of Allowance issued in U.S. Appl. No. 14/203,360, mailed Sep. 18, 2014.
United States Patent and Trademark Office, U.S. Appl. No. 13/947,400, mailed Oct. 3, 2014.
United States Patent and Trademark Office, Office Action issued in U.S. Appl. No. 13/760,977, mailed Dec. 2, 2014.
United States Patent and Trademark Office, Office Action issued in U.S. Appl. No. 12/943,134, mailed May 22, 2014.
Wang et al., "A New Type of Low Power Thermoelectric Micro-Generator Fabricated by Nanowire Array Thermoelectric Material," *Microelectronic Engineering*, 77(3-4): 223-229 (Apr. 1, 2005).
Bell, "Cooling, heating, generating power, and recovering waste heat with thermoelectric systems," Science, vol. 321, pp. 1457-1461, Sep. 12, 2008.
Ben-Chorin et al., "Hopping transport on a fractal: ac conductivity of porous silicon," Physical Review B, vol. 51, No. 4, pp. 2199-2213, Jan. 15, 1995.
Boukai et al, "Silicon nanowires as efficient thermoelectric materials," Nature, vol. 451, Jan. 10, 2000.
Bux et al., "Nanostructured bulk silicon as an effective thermoelectric material," Advanced Functional Materials 2009, 19, 2445-2452.
Cahill et al., "Lower limit to the thermal conductivity of disordered crystals," Physical Review B, vol. 46, No. 10, pp. 6131-6140, Sep. 1, 1992.
Chiritescu et al., "Ultralow thermal conductivity in disordered, layered $WSe_2$ crystals," Science, vol. 315, pp. 351-353, Jan. 19, 2007.
Cui, "High performance silicon nanowire field effect transistors," Nano Letters, 2003, vol. 3, No. 2 pp. 149-152, Nov. 1, 2002.
Gesele et al., "Temperature-dependent thermal conductivity of porous silicon," J. Phys. D: Appl. Phys. 30 (1997) 2911-2916, May 19, 1997.
Haick et al., "Electrical characteristics and chemical stability of non-oxidized, methyl-terminated silicon nanowires," J. Am. Chem. Soc. 2006, 128, 8990-8991, Oct. 4, 2005.
Hao et al., "Frequency-dependent Monte Carlo simulations of phonon transport in two-dimensional porous silicon with aligned pores," Journal of Applied Physics 106, 114321 (2009), Dec. 15, 2009.
Majumdar, A., "Lower limit of thermal conductivity: diffusion versus localization," Technical Discussion, Microscale Thermophysical Engineering, 2:5-9, 1998, © 1998 Taylor & Francis 1089-3954/98.
Mathur et al., "Thermoelectric power in porous silicon," Journal of Applied Physics, vol. 83, No. 11, pp. 5855-5857, Jun. 1, 1998.
Park et al., "Fabrication of highly ordered silicon oxide dots and stripes from block copolymer thin films," Advanced Materials 2008, 20, 681-685.
Snyder et al., "Complex thermoelectric materials," Nature Materials, vol. 7, pp. 105-112, Feb. 2008.
Swartz et al., "Thermal boundary resistance," Reviews of Modern Physics, vol. 61, No. 3, pp. 605-668, Jul. 1989.

(56) References Cited

OTHER PUBLICATIONS

Tang et al., "Holey Silicon as an Efficient Thermoelectric Material JIB-2854," abstract, Lawrence Berkeley National Laboratory, Apr. 8, 2011. Downloaded from http://lbl.gov.Tech-Transfer/techs/lbnl2854.html on Apr. 14, 2011 (one page).

Tritt et al., "Thermoelectrics: Direct solar thermal energy conversion," MRS Bulletin, vol. 33, Apr. 2008.

Vazquez-Mena et al., "Metallic nanowires by full wafer stencil lithography," Nano Letters, 2008, vol. 8, No. 11, 3675-3682, Aug. 11, 2008.

Yamamoto et al., "Thermoelectric transport properties of porous silicon nanostructure," 18th International Conference on Thermoelectrics (1999), © 2000 IEEE 0/7803-5451-6/00.

Yang et al., "Thermoelectric materials for space and automotive power generation," MRS Bulletin, vol. 31, pp. 224-229, Mar. 2006.

United States Patent and Trademark Office, Notice of Allowance issued in U.S. Appl. No. 14/059,362, mailed Jan. 8, 2015.

United States Patent and Trademark Office, Office Action issued in U.S. Appl. No. 14/203,360, mailed Jan. 26, 2015.

Masetti et al., "Modeling of Carrier Mobility Against Carrier Concentration in Arsenic-, Phosphorus-, and Boron-Doped Silicon," *IEEE Transactions on Electron Devices*, 30(7):764-769 (1983).

United States Patent and Trademark Office, Office Action issued in U.S. Appl. No. 13/430,558, mailed Jan. 30, 2015.

United States Patent and Trademark Office, Office Action issued in U.S. Appl. No. 13/299,179, mailed Feb. 26, 2015.

United States Patent and Trademark Office, Notice of Allowance issued in U.S. Appl. No. 14/059,362, mailed Mar. 6, 2015.

United States Patent and Trademark Office, Notice of Allowance issued in U.S. Appl. No. 13/947,400, mailed Mar. 24, 2015.

United States Patent and Trademark Office, Office Action issued in U.S. Appl. No. 13/364,176, mailed Apr. 29, 2015.

BULK NANO-RIBBON AND/OR NANO-POROUS STRUCTURES FOR THERMOELECTRIC DEVICES AND METHODS FOR MAKING THE SAME

1. CROSS-REFERENCES TO RELATED APPLICATIONS

This application claims priority to U.S. Provisional Application No. 61/607,739, filed Mar. 7, 2012, commonly assigned and incorporated by reference herein for all purposes.

2. BACKGROUND OF THE INVENTION

The present invention is directed to nanostructures. More particularly, the invention provides bulk nano-ribbon and/or nano-porous structures. Merely by way of example, the invention has been applied to thermoelectric devices. However, it would be recognized that the invention has a much broader range of applicability, including but not limited to use in transistor, solar power converter, battery electrodes and/or energy storage, catalysis, and/or light emitting diodes.

Conventional nanostructure devices, such as nanohole and nanomesh devices, have been shown to have good thermoelectric figures of merit ZT. $ZT=S^2\sigma/k$, where S is the material's thermopower, $\sigma$ is the electrical conductivity, and k is the thermal conductivity. These devices have been formed in thin silicon-on-insulator epitaxial layers or formed from arrays of nanowires, and result in nanoscale structures in thin films that are very small in physical size. For example, some conventional silicon nanoholes have been fabricated from a thin silicon film of 10-1000 nm within a conventional silicon wafer, whereby the remainder of the silicon wafer that is about 500 µm thick is etched and discarded. In another example, the resulting conventional structures are thin films and resemble ribbons, which have been shown to be microns wide and microns long, tens to hundreds of nanometers thick, with 1-100 nm diameter holes within. These conventional structures demonstrate the ability of closely-packed nanostructures to affect phonon thermal transport by reducing thermal conductivity while not affecting electrical properties greatly, thereby improving thermoelectric efficiency ZT.

Fabrication of certain nanostructures includes formation of nanowires and nanoholes from a single piece of material. For example, certain block copolymer patterning techniques are known for nano-scaled surface patterning. In another example, certain nanostructures have an aspect ratio of over 100:1 with feature size of several tens of nanometers to hundreds of nanometers. Low cost material like silicon is a target material for forming such nanostructures for the manufacture of high-performance thermoelectrics. It has been shown that silicon nanowires with low thermal conductivity can be fabricated using low cost, scalable process, but demonstrating certain difficulty in forming good electrical contacts with all nanowires. In another example, silicon nanoholes or holey silicon structures also are characterized by low thermal conductivity and being easier to form electrical contacts. But the holey silicon structures often are formed based on processes that are not very cost effective for large scale manufacture. In yet another example, the holey silicon structures are formed in silicon-on-insulator thin film which limits its scalability to form bulk-sized structures to be used for thermoelectric devices.

Hence, it is highly desirable to improve techniques of nanostructure devices.

3. BRIEF SUMMARY OF THE INVENTION

The present invention is directed to nanostructures. More particularly, the invention provides bulk nano-ribbon and/or nano-porous structures. Merely by way of example, the invention has been applied to thermoelectric devices. However, it would be recognized that the invention has a much broader range of applicability, including but not limited to use in transistor, solar power converter, battery electrodes and/or energy storage, catalysis, and/or light emitting diodes.

According to one embodiment, a structure including nano-ribbons include multiple nano-ribbons. Each of the multiple nano-ribbons corresponds to a first end and a second end, and the first end and the second end are separated by a first distance of at least 100 µm. Each of the multiple nano-ribbons corresponds to a cross-sectional area associated with a ribbon thickness, and the ribbon thickness ranges from 5 nm to 500 nm. Each of the multiple nano-ribbons is separated from at least another nano-ribbon selected from the multiple nano-ribbons by a second distance ranging from 5 nm to 500 nm.

According to another embodiment, a structure including one or more nano-ribbons includes a nano-ribbon including multiple nano-ribbon parts. Each of the multiple nano-ribbon parts corresponding to a first end and a second end, and the first end and the second end are separated by a first distance of at least 100 µm. Each of the multiple nano-ribbon parts corresponds to a cross-sectional area associated with a thickness, and the thickness ranging from 5 nm to 500 nm. Each of the multiple nano-ribbon parts is separated from at least another nano-ribbon part selected from the multiple nano-ribbon parts by a second distance ranging from 5 nm to 500 nm.

According to yet another embodiment, a porous structure includes a porous semiconductor substrate including multiple first voids. The multiple first voids are connected with each other. Each of the multiple first voids corresponds to a first cross-sectional area associated with a first distance across, and the first distance across ranges from 5 nm to 500 nm. Each of the multiple first voids is separated from at least another void by a first distance ranging from 5 nm to 500 nm.

According to yet another embodiment, a method for making a structure including nano-ribbons includes providing a semiconductor substrate including a first surface. The first surface includes first portions and second portions. Additionally, the method includes forming one or more layers on the first portions of the first surface. The second portions of the first surface are exposed. Moreover, the method includes etching the semiconductor substrate through the second portions of the first surface to form at least multiple nano-ribbons. Each of the nano-ribbons corresponds to a first end and a second end, and the first end and the second end are separated by a first distance of at least 100 µm. Each of the nano-ribbons corresponds to a cross-sectional area associated with a ribbon thickness ranging from 5 nm to 500 nm, and each of the nano-ribbons is separated from at least another nano-ribbon selected from the multiple nano-ribbons by a second distance ranging from 5 nm to 500 nm.

According to yet another embodiment, a method for making a structure including one or more nano-ribbons includes providing a semiconductor substrate including a first surface. The first surface includes first portions and second portions. Additionally, the method includes forming one or more layers on the first portions of the first surface. The second portions of the first surface are exposed. Moreover, the method includes etching the semiconductor substrate through the second portions of the first surface to form at least one nano-ribbon including multiple nano-ribbon parts. Each of the nano-ribbon parts corresponds to a first end and a second end, and the first end and the second end are separated by a first distance of at least 100 µm. Each of the nano-ribbon parts corresponds to a cross-sectional area associated with a thickness ranging from 5 nm to 500 nm. Each of the nano-ribbon parts is separated from at least another nano-ribbon part selected from the multiple nano-ribbon parts by a second distance ranging from 5 nm to 500 nm.

According to yet another embodiment, a method for making a porous structure includes providing a nonporous semiconductor substrate including one or more surfaces. The one or more surfaces include first portions and second portions. Additionally, the method includes forming one or more layers on the first portions of the one or more surfaces. The second portions of the one or more surfaces are exposed. Moreover, the method includes etching the nonporous semiconductor substrate through the second portions of the one or more surfaces to form a porous semiconductor substrate including multiple first voids connected with each other. Each of the multiple first voids corresponds to a first cross-sectional area associated with a first distance across ranging from 5 nm to 500 nm, and each of the multiple first voids are separated from at least another void by a first distance ranging from 5 nm to 500 nm.

Depending upon the embodiment, one or more benefits may be achieved. These benefits and various additional objects, features, and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

Figure 1:
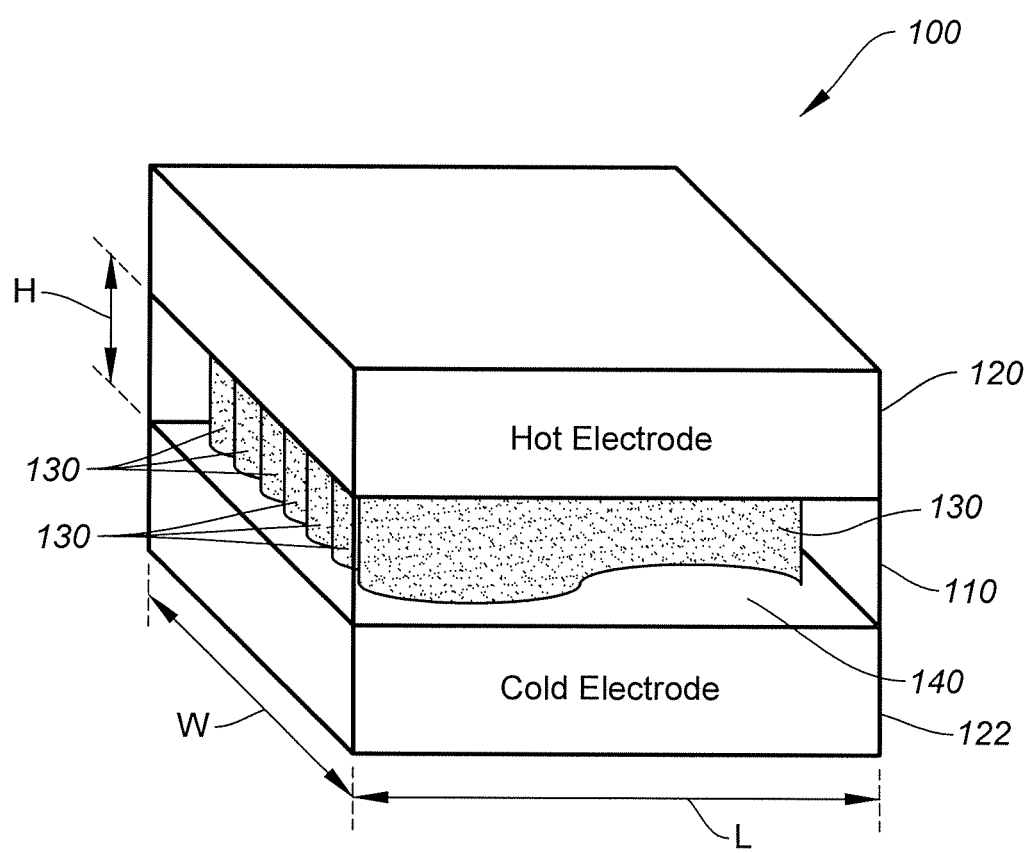
FIG. 1 is a simplified diagram showing a bulk nanostructure including one or more fill materials and bounded by electrode structures for forming a thermoelectric device structure according to one embodiment of the present invention.

The present invention is directed to nanostructures. More particularly, the invention provides bulk nano-ribbon and/or nano-porous structures. Merely by way of example, the invention has been applied to thermoelectric devices. However, it would be recognized that the invention has a much broader range of applicability, including but not limited to use in transistor, solar power converter, battery electrodes and/or energy storage, catalysis, and/or light emitting diodes.

To improve techniques of nanostructure devices, it is of interest to transform nanostructure into bulk electronic devices. These devices may be transistors, thermoelectrics, or other electronic devices. For example, a bulk nanostructure thermoelectric device used for power generation should transport a significant amount of electric current from one electrode to another, where a temperature gradient is applied to the thermoelectric material and the Seebeck effect is employed to generate a gradient in voltage and in turn the flow of electrical current. In another example, a bulk nanostructure thermoelectric device used for refrigeration should carry an appreciable amount of heat with an applied electric current by way of the Peltier effect. In both of these configurations for thermoelectric devices, ZT of the thermoelectric material is one indicator of the material's efficiency in either converting heat to electricity (e.g., thermopower) or pumping heat with electricity.

In certain embodiments, in a bulk nanostructure thermoelectric device, electrodes should be placed on either ends of the thermoelectric material in order to collect a current from the thermoelectric material or transmit a current through the thermoelectric material. For example, these electrodes should be made such that the electrodes make low resistance electrical and thermal contact to the thermoelectric material with high ZT, and furthermore allow each thermoelectric unit of p-type or n-type semiconductor thermoelectric material (e.g., each thermoelectric leg) to be wired together with one or more other thermoelectric units and/or the external circuitry.

In some embodiments, the interesting applications for bulk nanohole thermoelectric device include heat energy scavenging for powering sensors, Peltier cooling of electronics hotspots, and waste-heat recovery from exhaust and other heat sources, among others. According to one embodiment, in order for a bulk nanohole thermoelectric device to be usefully applied to one or more of these applications, as an example, not only should suitable electrodes be made on the thermoelectric material, but an appreciable amount of the thermoelectric material itself should be fabricated to meet the geometrical and electrical specifications of the application. According to another embodiment, in thermoelectric power generation from a heat source using the Seebeck effect, enough volume of thermoelectric material should be present between a hot-junction and a cold junction (e.g., in a counterflow gas phase heat exchanger) so as to allow both an appreciable temperature gradient to evolve across thermoelectric legs and to allow enough current to be carried due to the temperature-induced voltage.

In more detail, a thermoelectric material fabricated with small outer dimensions, such as the conventional structures demonstrated incorporating nanoholes with relative short lengths, usually suffer from very high current densities that may preclude their use in a thermoelectric application. Furthermore, such thermoelectric structure often may not generate sufficient power or heat pumping that is applicable or cost-effective. Hence, the ability to process nanostructures for making high-performance thermoelectric devices would have signification cost advantages, if the nanostructures are fabricated with methods that are compatible with the processing of silicon and other semiconductor wafers, according to some embodiments.

For example, one may consider a thin-film thermoelectric material whose dimensions laterally in the x-y plane (e.g., in the plane of a semiconductor wafer) are on the order of hundreds of microns to millimeters, and whose dimensions vertically (e.g., cross the plane of a semiconductor wafer) are only 10-1000 nm. In another example, the thermoelectric generation power density, $\delta$, of such a device in a load-matched condition, where the temperature gradient is applied in the z direction, is:

$$\delta = \frac{I^2 R}{A} = \frac{V^2}{(R_{internal} + R_{load}) \times (L_x \times L_y)} = \frac{V^2}{2\rho \times L_z} \quad \text{(Equation 1)}$$

where I is the current in the sample-load circuit, $R_{internal}$ is the internal resistance of the thermoelectric material, $R_{load}$ is the resistance of the load, R is the sum of $R_{internal}$ and $R_{load}$. Additionally, A is the x-y cross-sectional area of the thermoelectric material that is orthogonal to the temperature gradient applied in the z direction, V is the voltage generated by the thermoelectric material, and $\rho$ is the electrical resistivity of the thermoelectric material. Moreover, $L_x$, $L_y$, and $L_z$ are the sample dimensions in the x, y, and z directions respectively.

As shown in Equation 1, for per unit area of power-generation thermoelectric material sample, the thermoelectric power can increase if the voltage generated by the sample is larger or if the electrical resistance of the sample is lower according to one embodiment. For example, the voltage generated by the sample can be increased by selecting a thermoelectric material with a larger Seebeck coefficient S (e.g., S is equal to dV/dT). In another example, the electrical resistance of the sample can be lowered by decreasing the sample length $L_z$ along the axis of the temperature gradient and/or selecting a thermoelectric material with lower resistivity.

According to another embodiment, the total amount of power P produced by the thermoelectric material sample, rather than the power density, is then:

$$P = \frac{V^2 \times (L_x \times L_y)}{2\rho \times L_z} \quad \text{(Equation 2)}$$

As shown in Equation 2, for example, the thermoelectric sample that is larger in lateral x and y dimensions can produce more power, because there would be more thermoelectric material participating in the generation of voltage from an applied temperature gradient, and therefore more current generated. In another example, the thermoelectric power generation becomes problematic if a thermoelectric device is made from a thin thermoelectric film where the direction of thermal and electrical transport is in the x-y plane of the thin film, and not in the z direction.

For a conventional thermoelectric thin film with nanoholes within it, the temperature gradient often needs to be applied in a direction that is orthogonal to the z direction of the thin film so as to take advantage of the beneficial effects of the nanohole structure within the material. But, in such an arrangement, a very small amount of thermoelectric material usually can contribute to the thermoelectric conversion. For example, if the temperature gradient is applied in the y direction, referring to Equation 2, the transverse area (e.g., the cross-sectional area that is exposed to a temperature gradient through which a current may flow) is no longer $L_x \times L_y$, but instead is equal to $L_x \times L_z$, where z is the cross-plane direction (e.g., thickness direction) of the thin film. If the z height of the thin film is only about 100 nm and the lateral dimensions are as large as several millimeters, the thermoelectric conversion would be significantly restricted in terms of the amount of electric power it can generate according to one embodiment. In another embodiment, since P is linearly proportional to the transverse area, going from a thin film thicknesses of 100 nm to greater than 100 μm would increase power generation by about 1000 times.

Therefore, when fabricating thermoelectric nanostructures from a finite wafer of material or the like, it is desirable to transform as much of the starting wafer material as possible into the thermoelectric nanostructures according to some embodiments. For example, since the commercial performance, and thus usefulness, of a power generation thermoelectric device is governed by its cost-per-Watt, it is beneficial to process a piece of material in such a fashion that maximizes its use as a thermoelectric material, because most of the two-dimensional semiconductor fabrication processes or the like usually cost about the same amount regardless of the thickness of the material being processed.

It is also desirable to form a bulk-like structure that can combine advantages of both the nanohole structure and the ultra-long nanowire structure, featuring both ultra low thermal conductivity and strong mechanical stiffness at far greater thickness ranges than those for thin-film holey silicon structures in order to achieve significant commercial applicability according to some embodiments. For example, techniques for the formation of very large or bulk-like nano-ribbon and/or nano-porous structures combining certain desirable characteristics of nanowires and holey structures are implemented based on silicon and/or other less expensive and/or less toxic semiconductor materials. In another example, methods are also provided for synthesizing the bulk nano-ribbon and/or nano-porous structures and making electrical contacts as their corresponding hot electrodes and/or cold electrodes to form one or more thermoelectric legs.

FIG. 1 is a simplified diagram showing a bulk nanostructure including one or more fill materials and bounded by electrode structures for forming a thermoelectric device structure according to one embodiment of the present invention. This diagram is merely an example, which should not unduly limit the scope of the claims. One of ordinary skill in the art would recognize many variations, alternatives, and modifications. The thermoelectric device structure 100 includes a bulk nanostructure 110 and electrode structures 120 and 122.

In one embodiment, the bulk nanostructure 110 includes a bulk nano-ribbon structure and/or a bulk nano-porous structure. For example, the bulk nanostructure 110 has a length L, a width W, and a height H, all of which are in macroscopic scale. In another example, each of the length L, the width W, and the height H is greater than a few millimeters, or greater than a few centimeters, or greater than tens of centimeters and greater. In another embodiment, the bulk nanostructure 110 includes multiple nano-ribbons 130 that form parts of the bulk nano-ribbon structure or the bulk nano-porous structure. For example, the multiple nano-ribbons 130 are substantially parallel to each other. In another example, the nano-ribbons 130 have nanoholes in their sidewalls (e.g., one or more roughened sidewalls and/or one or more un-roughened sidewalls) respectively, and form parts of the bulk nano-porous structure. In yet another example, the nano-ribbons 130 do not have multiple nanoholes in their sidewalls (e.g., one or more roughened sidewalls and/or one or more un-roughened sidewalls), and form parts of the bulk nano-ribbon structure. In yet another example, the nano-ribbons 130 each have one or more roughened sidewalls with surface roughness in nanometer scale. In yet another example, the bulk nanostructure 110 also includes one or more fill materials 140 that fill all the void spacing between the nano-ribbons 130.

In another embodiment, the height of each of the multiple nano-ribbons 130 is larger than 10 µm, larger than 100 µm, larger than 250 µm, larger than 400 µm, or larger than 500 µm. For example, the thickness of each of the multiple nano-ribbons 130 ranges from 5 nm to 500 nm. In another example, each of the multiple nano-ribbons 130 is separated from another nano-ribbon 130 by spatial separation (e.g., a pitch distance) ranging from 5 nm to 500 nm.

According to one embodiment, the bulk nanostructure 110 also includes one or more fill materials 140. For example, the nano-ribbons 130 are partially or completely separated from each other by voids. In another example, one or more of the voids are completely surrounded by one or more solid materials of the bulk nanostructure 110. In yet another example, one or more of the voids are open to an area outside the bulk nanostructure 110. In yet another example, the voids are filled with the one or more fill materials 140. In yet another example, the one or more fill materials 140 also fill the nanoholes within the nano-ribbons 130.

According to another embodiment, the one or more fill materials 140 form a matrix (e.g., a porous matrix). For example, the one or more fill materials 140 have a low thermal conductivity. In another example, the one or more fill materials 140 also have a low electrical conductivity. In yet another example, the thermal conductivity is between 0.0001 W/(m·K) and 50 W/(m·K). In yet another example, the one or more fill materials 140 have a low coefficient of thermal expansion. In yet another example, the linear coefficient of thermal expansion is between 0.01 µm/m·K and 30 µm/m·K.

In yet another example, the one or more fill materials 140 are able to withstand temperatures in excess of 350° C. for extended periods of device operation. In yet another example, the one or more fill materials 140 are able to withstand temperatures in excess of 550° C. for extended periods of device operation. In yet another example, the one or more fill materials 140 are able to withstand temperatures in excess of 650° C. for extended periods of device operation. In yet another example, the one or more fill materials 140 are able to withstand temperatures in excess of 750° C. In yet another example, the one or more fill materials 140 are able to withstand temperatures in excess of 800° C.

In yet another example, the one or more fill materials 140 provide added mechanical stability to the nano-ribbons 130. In yet another example, the one or more fill materials 140 are able to be planarized. In yet another example, the one or more fill materials 140 are able to be polished. In yet another example, the one or more fill materials 140 provide a support base for additional material overlying thereon. In yet another example, the one or more fill materials 140 support the formation of good electrical contacts with the nano-ribbons 130. In yet another example, the one or more fill materials 140 support the formation of good thermal contacts with the nano-ribbons 130.

According to certain embodiments, the one or more fill materials 140 each include at least one selected from a group consisting of photoresist, spin-on glass, spin-on dopant, aerogel, xerogel, and oxide, and the like. For example, the photoresist includes long UV wavelength G-line (e.g., approximately 436 nm) photoresist. In another example, the photoresist has negative photoresist characteristics. In yet another example, the photoresist exhibits good adhesion to various substrate materials, including Si, GaAs, InP, and glass. In yet another example, the photoresist exhibits good adhesion to various metals, including Au, Cu, and Al. In yet another example, the spin-on glass has a high dielectric constant. In yet another example, the aerogel is derived from silica gel characterized by an extremely low thermal conductivity of about 0.1 W/(m·K) and lower. In yet another example, the one or more fill materials 140 include long chains of one or more oxides. In yet another example, the oxide includes $Al_2O_3$, FeO, $FeO_2$, $Fe_2O_3$, TiO, $TiO_2$, $ZrO_2$, ZnO, $HfO_2$, CrO, $Ta_2O_5$, SiN, TiN, BN, $SiO_2$, AlN, CN, and/or the like.

As shown in FIG. 1, the bulk nanostructure 110 is sandwiched between the electrode structures 120 and 122. For example, the bulk nanostructure 110 is in electrical contact with each of the electrode structures 120 and 122. In another example, each of the electrode structures 120 and 122 includes one or more thermal and electrical contact materials, serving as both an electrode and a thermal terminal. In yet another example, the electrode structures 120 and 122 are set at two different temperatures, and provide a temperature gradient across the bulk nanostructure 110.

In one embodiment, the bulk nanostructure 110 is made from a bulk semiconductor substrate for forming one or more electronic devices such as transistors, solar cells, thermoelectric elements, battery/energy storage cells, and/or light emitting diodes. For example, a pure or doped crystal silicon substrate is used to form the bulk nanostructure 110. In another embodiment, the top portion and/or the bottom portion of the bulk nanostructure 110 made from the bulk semiconductor substrate, after filled with a low thermal conductivity and low electrical conductivity fill material, can be flattened for coupling thermally and electrically to the electrode structures 120 and 122 respectively. For example, the electrode structures 120 and 122 can serve as a hot electrode and a cold electrode respectively, for forming a thermoelectric element. In another example, by utilizing high thermoelectric figures of merit ZT of the bulk nanostructure 110, the thermoelectric element can be used as a building block to form one or more high efficiency thermoelectric devices.

Figure 2:
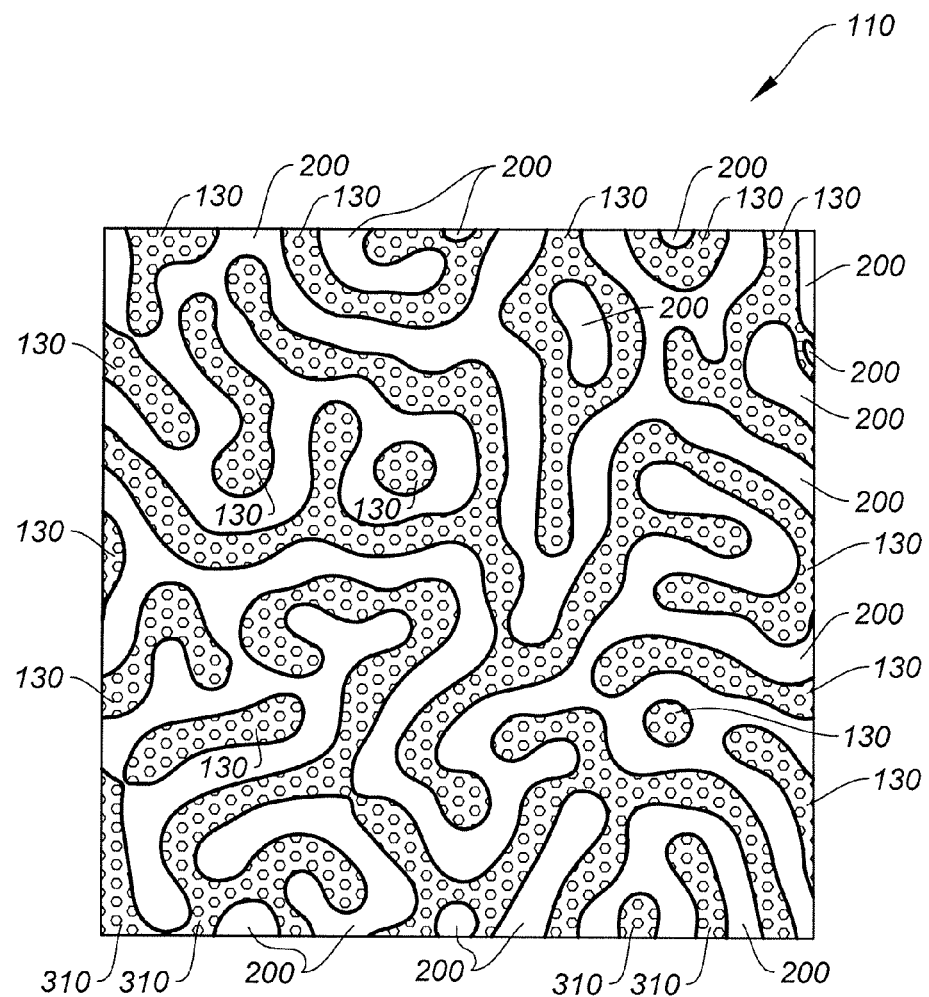
FIG. 2 is a simplified diagram showing a top view of the bulk nanostructure as part of the thermoelectric device structure according to one embodiment of the present invention.

As discussed above and further emphasized here, FIG. 1 is merely an example, which should not unduly limit the scope of the claims. One of ordinary skill in the art would recognize many variations, alternatives, and modifications. For example, the multiple nano-ribbons 130 are parts of a thermoelectric device. In another example, the multiple nano-ribbons 130 are replaced by at least a nano-ribbon that is folded into multiple nano-ribbons parts and includes the multiple nano-ribbons parts. In yet another example, the multiple nano-ribbons 130 are arranged in a pattern comprising multiple isolated or partially connected fins as shown in FIG. 2. In yet another example, the pattern is configured to enlarge sidewall areas for all fins.

FIG. 2 is a simplified diagram showing a top view of the bulk nanostructure 110 as part of the thermoelectric device structure 100 according to one embodiment of the present invention. This diagram is merely an example, which should not unduly limit the scope of the claims. One of ordinary skill in the art would recognize many variations, alternatives, and modifications.

In one embodiment, the bulk nanostructure 110 includes multiple nano-ribbons 130 that form parts of a bulk nano-ribbon structure or a bulk nano-porous structure. For example, the nano-ribbons 130 have nanoholes in their sidewalls respectively, and form parts of the bulk nano-porous structure. In another example, the nano-ribbons 130 do not have multiple nanoholes in their sidewalls, and form parts of the bulk nano-ribbon structure. In another embodiment, the nano-ribbons 130 are separated, partially or completely, by voids 200. For example, the voids 200 are filled with the one or more fill materials 140. In another example, the nano-ribbons 130 are roughly 50/50 interlaced with the voids 200 to form a coral pattern or structure (e.g., a brain coral pattern or structure, a coral pattern or structure in nanometer scale).

As shown in FIG. 2, the multiple nano-ribbons 130 are formed by vertically extending the voids 200 with the coral pattern, resulting in substantial sidewall surface areas for the multiple nano-ribbons 130, according to some embodiments. For example, the multiple nano-ribbons 130 with the coral pattern is substantially interconnected, leading to an enhanced mechanical stiffness. In another example, each fin of the multiple nano-ribbons 130 has an average side-wall thickness of 1000 nm or less, and is separated, partially or completely, from a neighboring fin by a pitch size ranging from 100 nm to 20000 nm. In yet another example, each fin of the multiple nano-ribbons 130 has an average side-wall thickness ranging from 5 nm to 500 nm, and is separated, partially or completely, from a neighboring fin by a pitch size ranging from 5 nm to 500 nm.

According to certain embodiments, the coral pattern of the nano-ribbons 130 with nanoscale separations are created by applying one or more block copolymers over a silicon carbide hard mask overlying a silicon substrate. For example, the one or more block copolymers are made up of blocks of different polymerized monomers that undergo a phase separation. In another example, multiple blocks of one or more block copolymers are covalently bonded to each other, so these blocks do not demix macroscopically due to incompatibility between the blocks.

According to some embodiments, depending on the relative lengths of each block, several morphologies can be obtained. For example, in diblock copolymers, sufficiently different block lengths lead to nanometer-sized spheres of one monomer in a matrix of another monomer (e.g., PMMA in polystyrene). In another example, using less different block lengths, a hexagonally packed cylinder geometry can be obtained. In yet another example, blocks of similar block lengths can form one or more layers (e.g., one or more lamellae). In yet another example, between the cylindrical phase and the lamellar phase, there is the three-dimensional gyroid phase. In yet another example, other than forming a patter (e.g., a coral pattern) with nanoscale separations, the nanoscale structures created from block copolymers could also potentially be used for creating devices for use in computer memory and/or nanoscale-templating.

As discussed above and further emphasized here, FIG. 2 is merely an example, which should not unduly limit the scope of the claims. One of ordinary skill in the art would recognize many variations, alternatives, and modifications. For example, the volumes corresponding to the voids 200 become the nano-ribbons 130, and the volumes corresponding to the nano-ribbons 130 become the voids 200.

FIGS. 3A-3F are simplified diagrams each showing a top view of the bulk nanostructure 110 as part of the thermoelectric device structure 100 according to certain embodiments of the present invention. These diagrams are merely examples, which should not unduly limit the scope of the claims. One of ordinary skill in the art would recognize many variations, alternatives, and modifications.

Figure 3A:
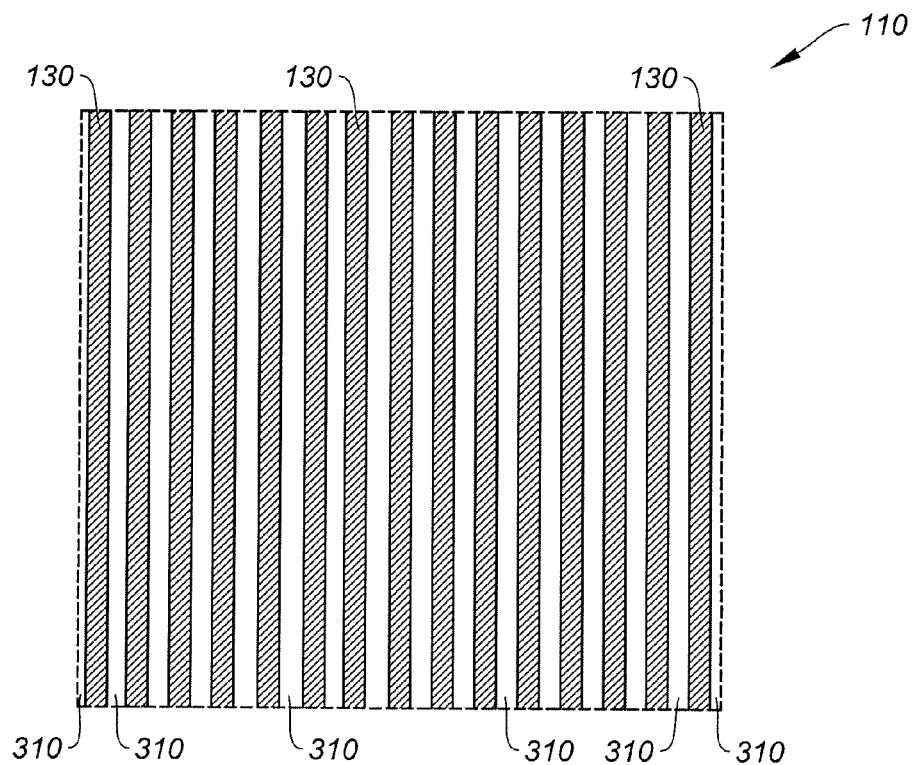
FIGS. 3A-3F are simplified diagrams each showing a top view of the bulk nanostructure as part of the thermoelectric device structure according to certain embodiments of the present invention.

As shown in FIG. 3A, the multiple nano-ribbons 130 each have a straight shape, and the multiple nano-ribbons 130 are substantially parallel with each other in the top view according to one embodiment. For example, the nano-ribbons 130 are separated, partially or completely, by voids 310. In another example, the voids 310 are filled with the one or more fill materials 140. As discussed above and further emphasized here, FIG. 3A is merely an example, which should not unduly limit the scope of the claims. One of ordinary skill in the art would recognize many variations, alternatives, and modifications. For example, in the top view, the nano-ribbons 130 do not have a constant width. In another example, in the top view, the spacing (e.g., the width of a void 310) between two of the nano-ribbons 130 is not constant. In yet another example, the volumes corresponding to the voids 310 become the nano-ribbons 130, and the volumes corresponding to the nano-ribbons 130 become the voids 310.

Figure 3B:
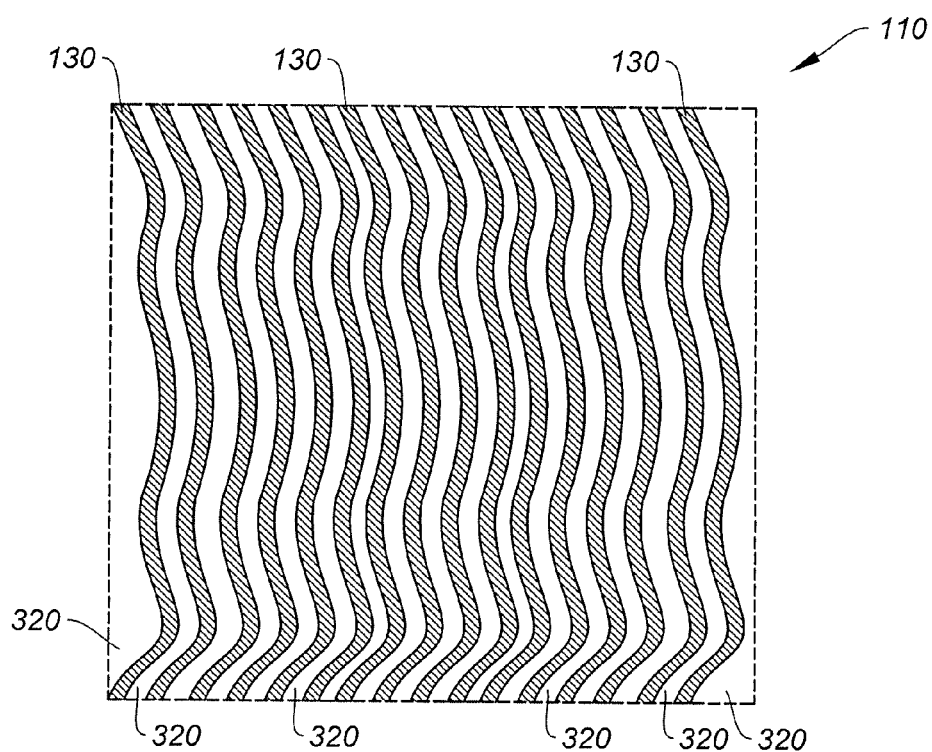

As shown in FIG. 3B, the multiple nano-ribbons 130 each have a curved shape, and the multiple nano-ribbons 130 are substantially parallel with each other in the top view according to another embodiment. For example, the nano-ribbons 130 are separated, partially or completely, by voids 320. In another example, the voids 320 are filled with the one or more fill materials 140. As discussed above and further emphasized here, FIG. 3B is merely an example, which should not unduly limit the scope of the claims. One of ordinary skill in the art would recognize many variations, alternatives, and modifications. For example, in the top view, the nano-ribbons 130 do not have a constant width. In another example, in the top view, the spacing (e.g., the width of a void 320) between two of the nano-ribbons 130 is not constant. In yet another example, the volumes corresponding to the voids 320 become the nano-ribbons 130, and the volumes corresponding to the nano-ribbons 130 become the voids 320.

Figure 3C:
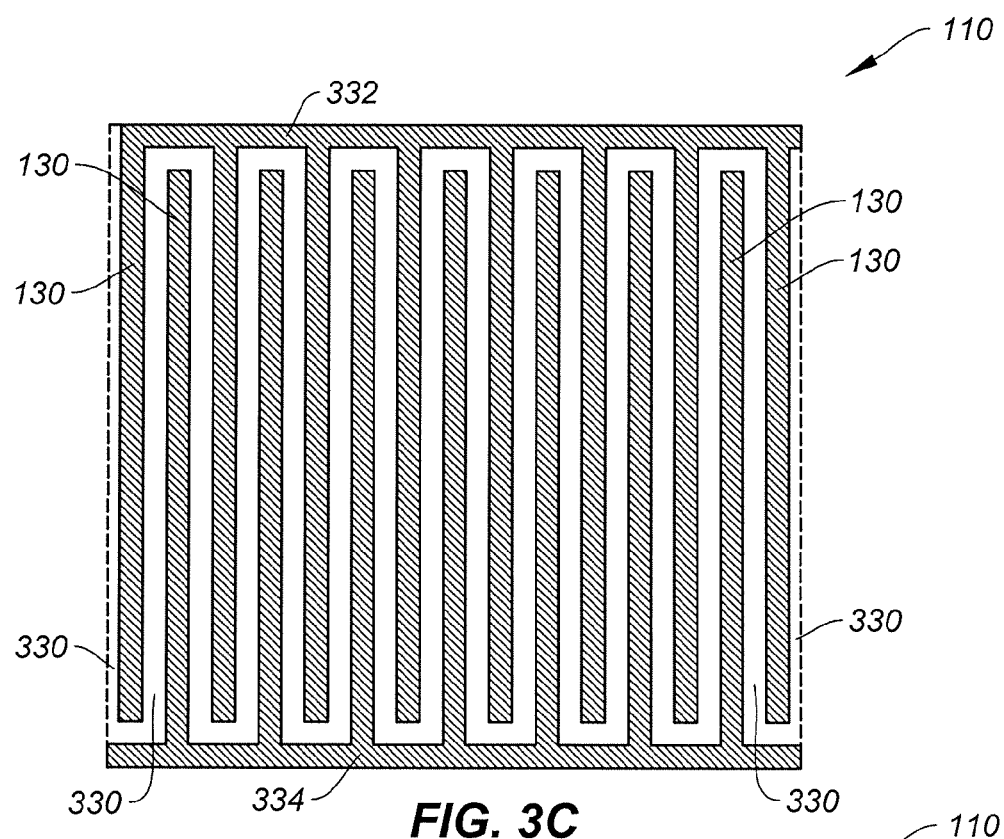

As shown in FIG. 3C, the multiple nano-ribbons 130 are organized into two fin structures 332 and 334 in the top view according to yet another embodiment. For example, the fin structures 332 and 334 each include multiple fingers. In another example, the fingers of the fin structure 332 extend toward to the fin structure 334, and the fingers of the fin structure 334 extend toward to the fin structure 332, with shifted spacing and mutual separation. In yet another example, the nano-ribbons 130 are separated, partially or completely, by voids 330. In another example, the voids 330 are filled with the one or more fill materials 140. As discussed above and further emphasized here, FIG. 3C is merely an example, which should not unduly limit the scope of the claims. One of ordinary skill in the art would recognize many variations, alternatives, and modifications. For example, in the top view, the nano-ribbons 130 do not have a constant width. In another example, in the top view, the spacing (e.g., the width of a void 330) between two of the nano-ribbons 130 is not constant. In yet another example, the volumes corresponding to the voids 330 become the nano-ribbons 130, and the volumes corresponding to the nano-ribbons 130 become the voids 330.

Figure 3D:
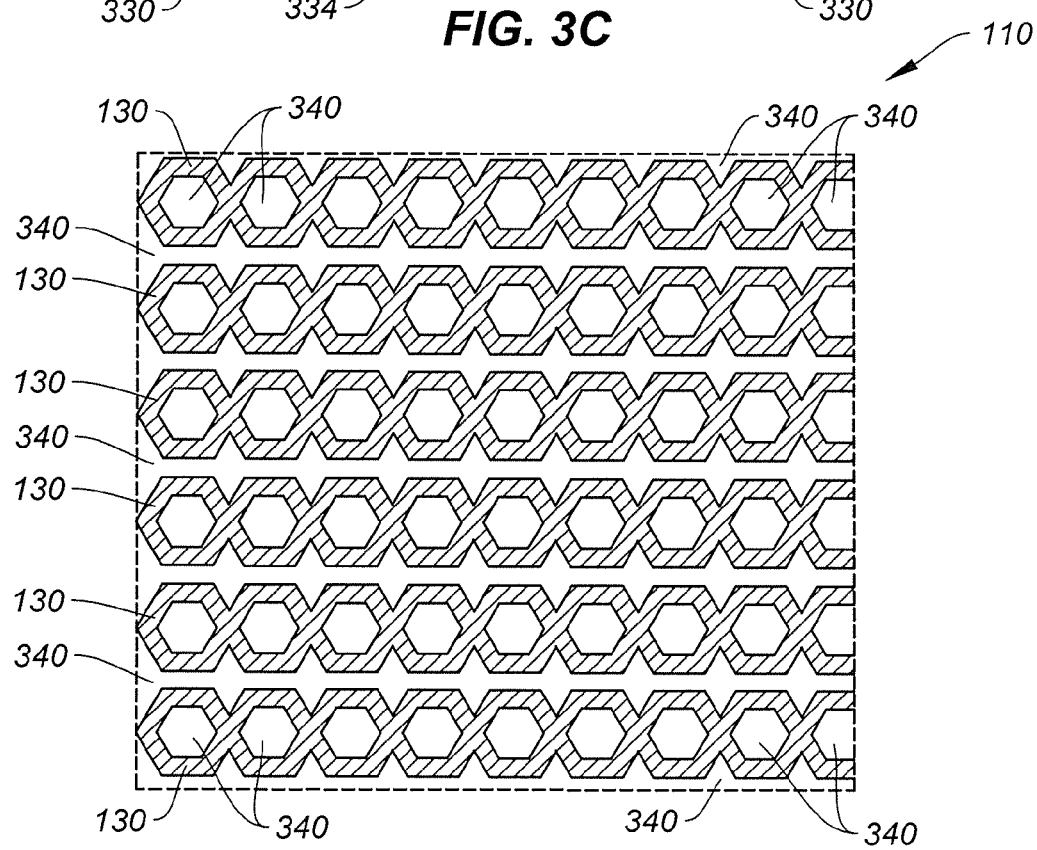

As shown in FIG. 3D, the multiple nano-ribbons 130 are organized into one or more honeycomb patterns in the top view according to yet another embodiment. For example, the nano-ribbons 130 are separated, partially or completely, by voids 340. In another example, the voids 340 are filled with the one or more fill materials 140. As discussed above and further emphasized here, FIG. 3D is merely an example, which should not unduly limit the scope of the claims. One of ordinary skill in the art would recognize many variations, alternatives, and modifications. For example, in the top view, the nano-ribbons 130 do not have a constant width. In another example, in the top view, the spacing between two of the nano-ribbons 130 is not constant.

Figure 3E:
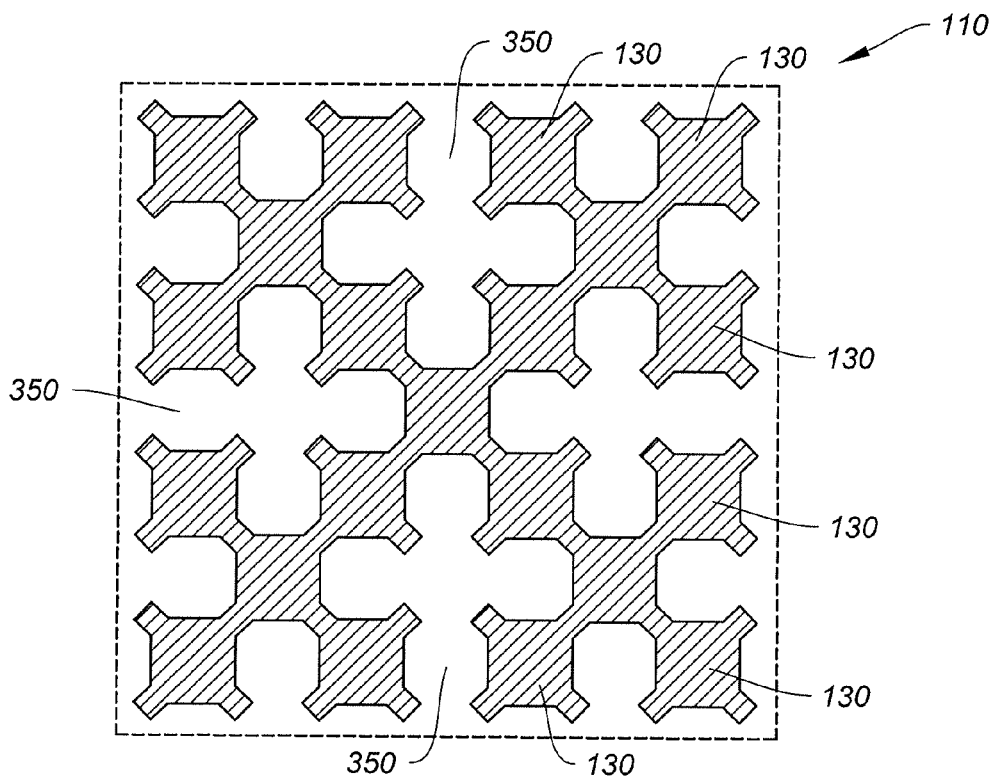

As shown in FIG. 3E, the multiple nano-ribbons 130 are organized into one or more Sierpinsky Curve patterns in the top view according to yet another embodiment. For example, the nano-ribbons 130 are separated, partially or completely, by voids 350. In another example, the voids 350 are filled with the one or more fill materials 140. As discussed above and further emphasized here, FIG. 3E is merely an example, which should not unduly limit the scope of the claims. One of ordinary skill in the art would recognize many variations, alternatives, and modifications. For example, in the top view, the nano-ribbons 130 do not have a constant length or a constant width. In another example, in the top view, the spacing between two of the nano-ribbons 130 is not constant. In yet another example, the volumes corresponding to the voids 350 become the nano-ribbons 130, and the volumes corresponding to the nano-ribbons 130 become the voids 350.

Figure 3F:
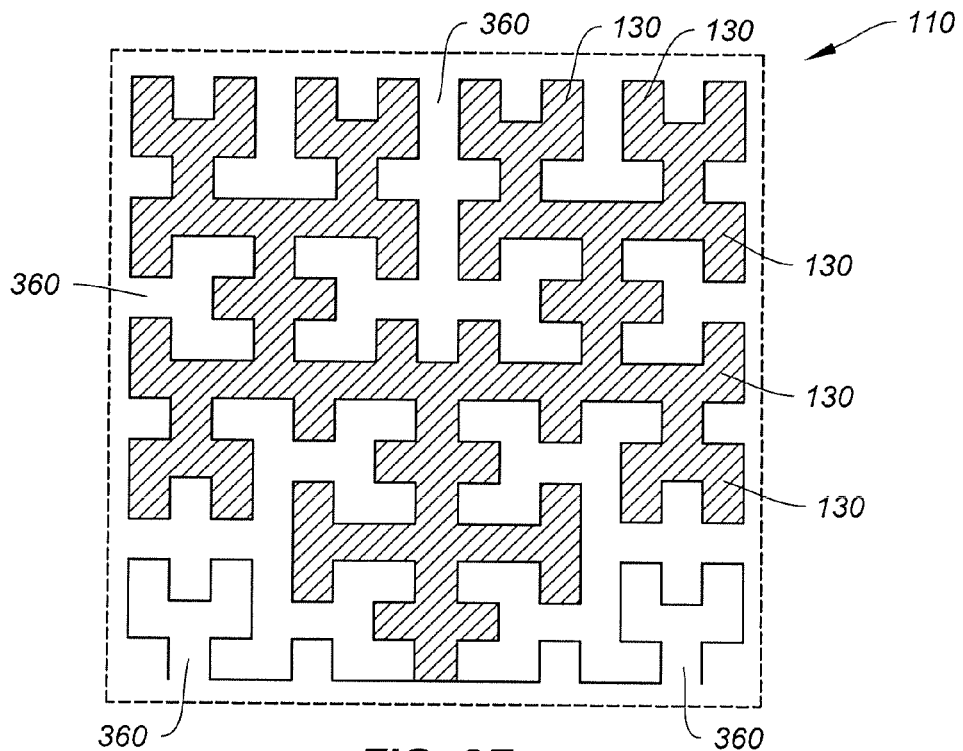

As shown in FIG. 3F, the multiple nano-ribbons 130 are organized into one or more Hilbert Curve patterns in the top view according to yet another embodiment. For example, the nano-ribbons 130 are separated, partially or completely, by voids 360. In another example, the voids 360 are filled with the one or more fill materials 140. As discussed above and further emphasized here, FIG. 3F is merely an example, which should not unduly limit the scope of the claims. One of ordinary skill in the art would recognize many variations, alternatives, and modifications. For example, in the top view, the nano-ribbons 130 do not have a constant length or a constant width. In another example, in the top view, the spacing between two of the nano-ribbons 130 is not constant. In yet another example, the volumes corresponding to the voids 360 become the nano-ribbons 130, and the volumes corresponding to the nano-ribbons 130 become the voids 360.

As discussed above and further emphasized here, FIGS. 2 and 3A-3F are merely examples, which should not unduly limit the scope of the claims. One of ordinary skill in the art would recognize many variations, alternatives, and modifications. For example, the multiple nano-ribbons 130 are replaced by at least a nano-ribbon that is folded into multiple nano-ribbons parts and includes the multiple nano-ribbons parts. In another example, the multiple nano-ribbons 130 are organized into one or more other two-dimensional fractal patterns with nanoscale separations in the top view. In yet another example, the one or more two-dimensional fractal patterns are formed using block copolymer patterning with various block monomer composition and/or using photolithography. In yet another example, the one or more two-dimensional fractal patterns are selected for their large boundary lengths in the top view in order to form the nano-ribbons 130 with enhanced stiffness. In yet another example, the bulk nanostructure 110 with more regular shaped patterns as shown in FIGS. 3A-3C can be made using conventional photolithography technique as part of the fabrication method, and such fabrication method should be comparable in cost for high volume manufacturing.

FIGS. 4A-4F are simplified diagrams showing a method for making the bulk nanostructure 110 as shown in FIG. 1, FIG. 2, FIG. 3A, FIG. 3B, FIG. 3C, FIG. 3D, FIG. 3E, and/or FIG. 3F according to certain embodiments of the present invention. These diagrams are merely examples, which should not unduly limit the scope of the claims. One of ordinary skill in the art would recognize many variations, alternatives, and modifications.

Figure 4A:
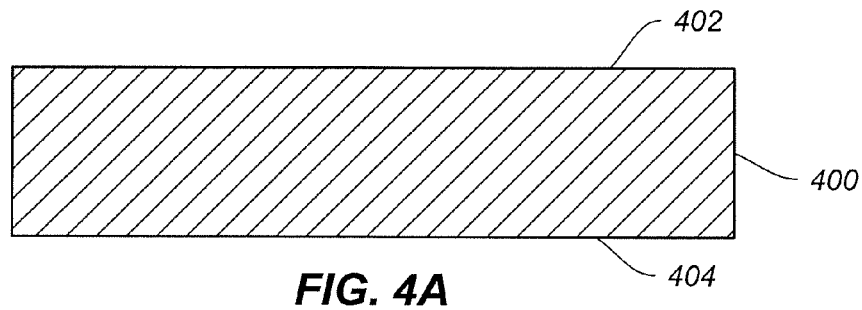
FIGS. 4A-4F are simplified diagrams showing a method for making the bulk nanostructure as shown in FIG. 1, FIG. 2, FIG. 3A, FIG. 3B, FIG. 3C, FIG. 3D, FIG. 3E, and/or FIG. 3F according to certain embodiments of the present invention.
Figure 4B:
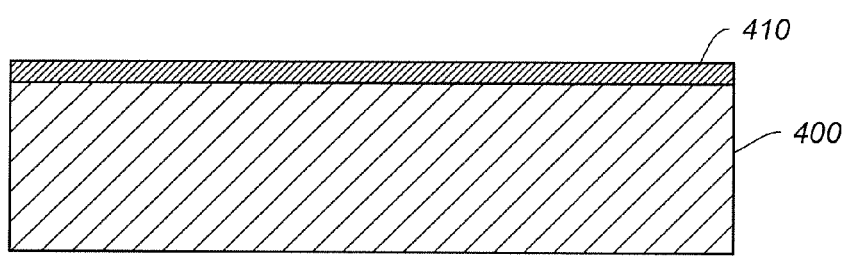
Figure 4C:
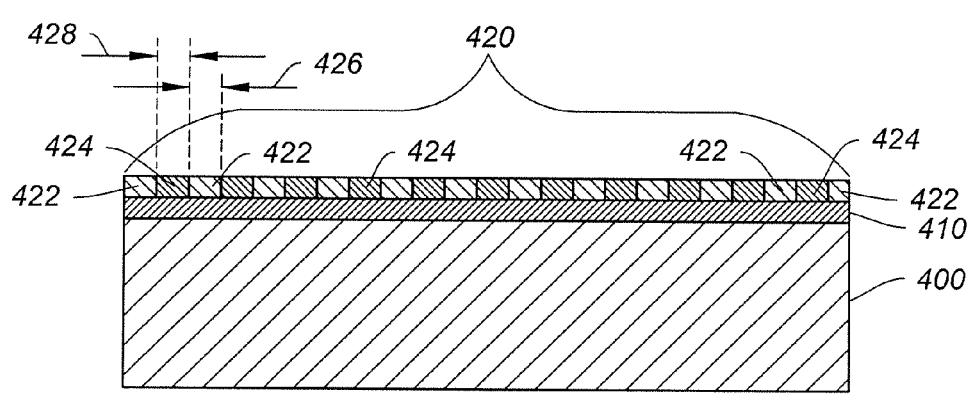
Figure 4D:
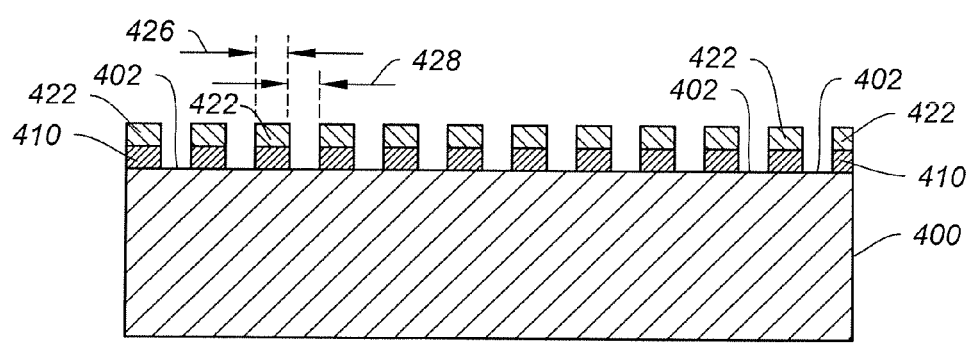
Figure 4E:
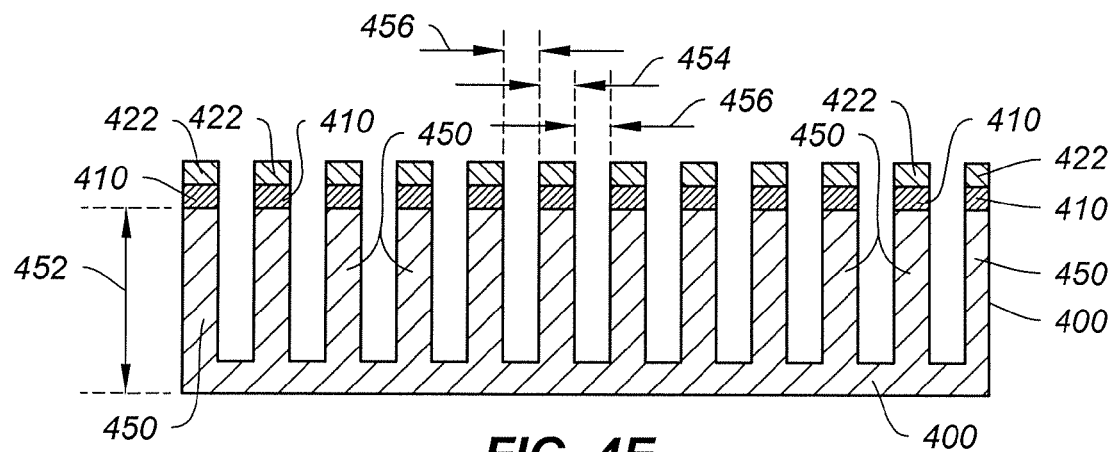
Figure 4F:
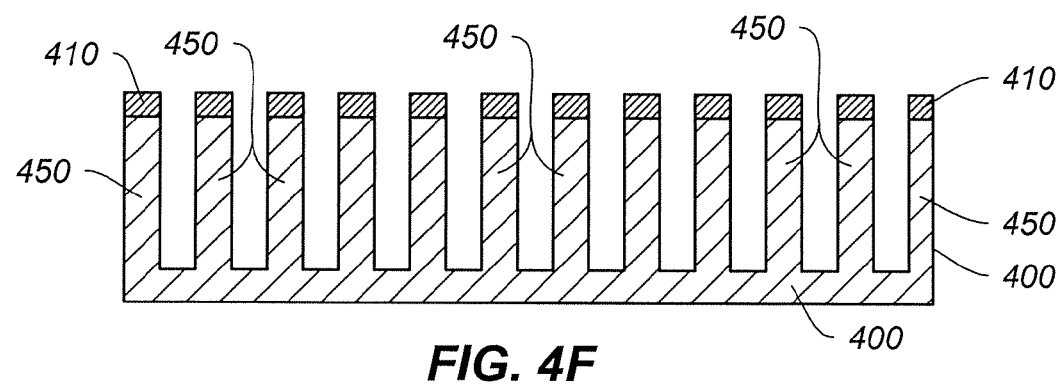

In one embodiment, the method for making the bulk nanostructure 110 includes the following sequential processes (a) through (f):

(a) providing a substrate for making the bulk nanostructure 110 (e.g., as shown in FIG. 4A);

(b) forming a mask layer on the substrate surface of the substrate (e.g., as shown in FIG. 4B);

(c) forming a patterning layer on the mask layer (e.g., as shown in FIG. 4C);

(d) removing certain blocks of the patterning layer and then also removing the exposed portions of the mask layer (e.g., as shown in FIG. 4D);

(e) removing portions of the substrate through the exposed regions of the substrate surface (e.g., as shown in FIG. 4E);

(f) removing the patterning layer from the mask layer (e.g., as shown in FIG. 4F).

The method described above is merely an example, which should not unduly limit the scope of the claims. One of ordinary skill in the art would recognize many variations, alternatives, and modifications. For example, one or more of the above listed processes are skipped. In another example, the above listed processes are performed in a different order. In yet another example, one or more additional processes are added.

As shown in FIG. 4A, a substrate 400 (e.g., a nonporous semiconductor substrate) is provided for making the bulk nanostructure 110. In one embodiment, the substrate 400 includes a substrate surface 402. In another embodiment, the substrate 400 is a silicon substrate (e.g., a silicon wafer). For example, the silicon substrate is doped into an n-type semiconductor or a p-type semiconductor with desired doping density. In another example, the silicon substrate is pretreated to reduce the total thickness of the silicon substrate to about 500 µm to 600 µm. In yet another example, the silicon substrate is prepared to have the clean surface 402 suitable for subsequent processes.

As shown in FIG. 4B, a mask layer 410 (e.g., a hard mask layer) is formed on the substrate surface 402 of the substrate 400. In one embodiment, the mask layer 410 includes silicon carbide. For example, the silicon carbide layer 410 is coated on the substrate surface 402 by chemical vapor deposition, electro-coating, and/or physical vapor deposition (PVD). In another example, the wide energy band gap of silicon carbide makes silicon carbide a good intermediate material for forming a semiconductor-metal contact. In another embodiment, the mask layer 410 includes silver. For example, the silver layer 410 is plated on the substrate surface 402. In another example, the silver layer 410, after a nano-patterning process, can be directly utilized for deep etch into the substrate 400 (e.g., the silicon substrate 400) using metal-assisted chemical etching technique.

As shown in FIG. 4C, a patterning layer 420 is formed on the mask layer 410. For example, the patterning layer 420 is made from a block copolymer material including two monomers corresponding to two different phases respectively. In another example, the patterning layer 420 includes blocks 422 of one of the two monomers, and blocks 424 of the other of the two monomers. In yet another example, depending on the composition of these two monomers in the block copolymer material, there are certain spatial distributions for the blocks 422 and 424. In yet another example, the blocks 422 have a width 426 ranging from 5 nm to 500 nm, and the blocks 424 have a width 428 ranging from 5 nm to 500 nm.

In one embodiment, the blocks 424 can be removed using a solvent that is selected to chemically react specifically with the blocks 424 while retaining the blocks 422. For example, the removal of the blocks 424 would expose corresponding portions of the mask layer 410 in a patterned distribution across the substrate 400 (e.g., across a bulk-sized range up to a whole wafer surface). In another embodiment, the patterned distribution includes nanoscale pattern features (e.g., the blocks 422) and nanoscale separations between the pattern features (e.g., the blocks 422). For example, the patterned distribution has an overall pattern size in a bulk dimension ranging from a few millimeters up to the whole wafer surface.

As shown in FIG. 4D, the blocks 424 of the patterning layer 420 are removed, and then the exposed portions of the mask layer 410 are also removed. In one embodiment, the removal of the blocks 424 exposes the corresponding portions of the mask layer 410 in a patterned distribution across the substrate 400, and then this patterned distribution with predetermined nanoscale separations is transferred to the mask layer 410. For example, the removal of the blocks 422 is performed by a wet etching process using a solvent that is selected to chemically react specifically with the blocks 424 while retaining the blocks 422.

In another example, the removal of the exposed portions of the mask layer 410 is performed by a plasma etching process. In yet another example, after the patterned distribution is transferred to the mask layer 410, the corresponding regions of the substrate surface 402 are exposed.

In another embodiment, the block copolymer material including the two monomers with a 50/50 ratio is used to form the patterning layer 422 in order to create a pattern having a feature size (e.g., the width 426) of about 1000 nm or less and a pitch size (e.g., the width 428) ranging from 100 nm to 20000 nm. For example, the created pattern has a feature size (e.g., the width 426) ranging from 5 nm to 500 nm, and a pitch size (e.g., the width 428) ranging from 5 nm to 500 nm.

As discussed above and further emphasized here, FIGS. 4C and 4D are merely examples, which should not unduly limit the scope of the claims. One of ordinary skill in the art would recognize many variations, alternatives, and modifications. In one embodiment, a photoresist material is formed overlying the mask layer 410. For example, using the photoresist material, a predetermined pattern with nanoscale separations between the pattern-features is created by photolithography (e.g., including a photomasking process, a light or electron exposure process, and a resist removal process). In another embodiment, the predetermined pattern is transferred to the mask layer 410, exposing the corresponding regions of the substrate surface 402.

As shown in FIG. 4E, portions of the substrate 400 are removed through the exposed regions of the substrate surface 402. In one embodiment, the exposed substrate material (e.g., the exposed silicon material) is etched to form multiple nano-ribbons 450. For example, the multiple nano-ribbons 450 are separated by one or more voids left behind by the removed portions of the substrate 400. In another example, the multiple nano-ribbons 450 are substantially perpendicular to the substrate surface 402. In yet another example, the multiple nano-ribbons 450 bear the same pattern deeply into the substrate 400 (e.g., the silicon substrate 400). In yet another example, the etching process includes a wet etching process (e.g., an electroless silver-assisted chemical etch and/or an electrolytic chemical etch). The etchant solution includes $AgNO_3$, HF, and $H_2O_2$. In yet another example, the etching process is substantially uni-directional as the Ag nano-particles deposited on the exposed regions of the substrate surface 402 guide the chemical reaction in anisotropic fashion to form the nano-ribbons 450 with a height 452.

In another embodiment, the etching process is controlled to extend the height of each of the multiple nano-ribbons 450 substantially vertically into the substrate 400. As the result, each of the nano-ribbons 450 is characterized by a thickness 454 through its height 452 and a pitch distance 456 from its neighbor. For example, the height 452 is larger than 10 μm. In another example, the height 452 is larger than 100 μm. In yet another example, the height 452 is larger than 250 μm. In yet another example, the height 452 is larger than 400 μm. In yet another example, the height 452 is larger than 500 μm. In yet another example, the height 452 is equal to the total thickness of the substrate 400.

In yet another embodiment, the height 452 of the multiple nano-ribbons 450 are controlled to be within a small variation range, forming a relative flat bottom region that has a lateral dimension substantially equal to that of the original pattern defined by the nano-patterning process on the mask layer 410. For example, the thickness 454 of the multiple nano-ribbons 450 is substantially copied from that original pattern. In another example, the thickness 454 ranges from 5 nm to 500 nm. In yet another example, the thickness 454 is about 300 nm or less. In yet another example, the pitch distance 456 ranges from 5 nm to 500 nm. In yet another example, the pitch distance 456 ranges from 100 nm to 200 nm.

As shown in FIG. 4F, the patterning layer 422 is removed from the mask layer 410. For example, the removal of the patterning layer 422 is performed after a cleaning process following etching the substrate as shown in FIG. 4E. In another example, the multiple nano-ribbons 450 are formed with nanoscale separations over a bulk sized range. In yet another example, the multiple nano-ribbons 450 are parts of a thermoelectric device. In yet another example, the multiple nano-ribbons 450 are the multiple nano-ribbons 130 as shown in FIG. 1, FIG. 2, FIG. 3A, FIG. 3B, FIG. 3C, FIG. 3D, FIG. 3E, and/or FIG. 3F.

Figure 5:
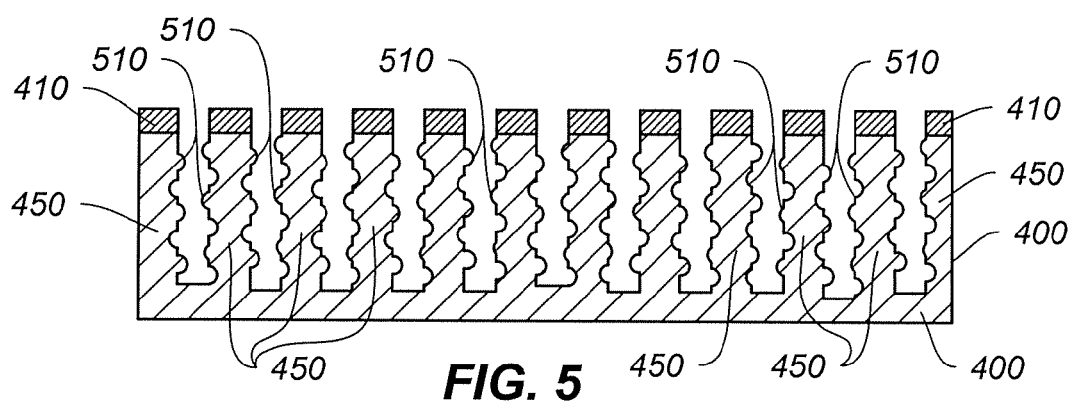
FIG. 5 is a simplified diagram showing a process for roughening sidewalls of the multiple nano-ribbons as a part of the method for making the bulk nanostructure as shown in FIG. 1, FIG. 2, FIG. 3A, FIG. 3B, FIG. 3C, FIG. 3D, FIG. 3E, and/or FIG. 3F according to some embodiments of the present invention.
Figure 6:
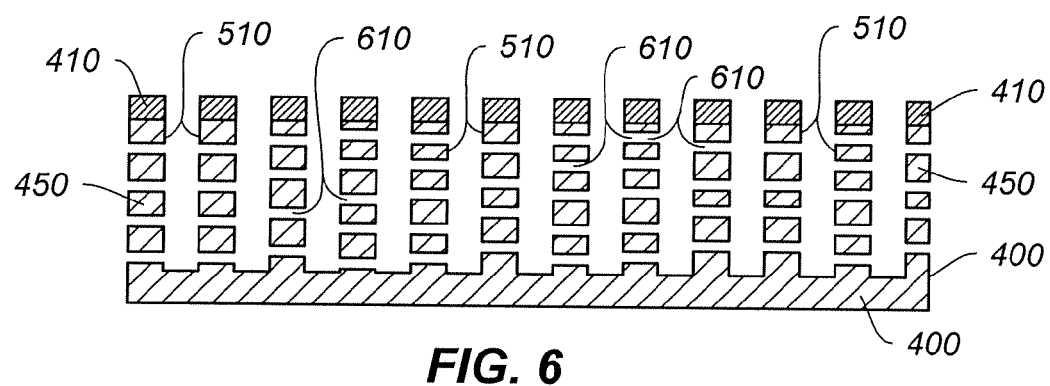
FIG. 6 is a simplified diagram showing a process for forming nanoholes in sidewalls through the multiple nano-ribbons as a part of the method for making the bulk nanostructure as shown in FIG. 1, FIG. 2, FIG. 3A, FIG. 3B, FIG. 3C, FIG. 3D, FIG. 3E, and/or FIG. 3F according to some embodiments of the present invention.

As discussed above and further emphasized here, FIGS. 4A-4F are merely examples, which should not unduly limit the scope of the claims. One of ordinary skill in the art would recognize many variations, alternatives, and modifications. For example, the method for making the bulk nanostructure 110 includes, after the processes (a) through (f), certain post treatment processes for substantially reducing thermal conductivity of the bulk nanostructure 110 in order to build a thermoelectric element with high thermoelectric figures of merit ZT. In another example, the method for making the bulk nanostructure 110 includes, after the processes (a) through (f), a process for filling the one or more voids (e.g., one or more separate regions) between the multiple nano-ribbons 450 with one or more fill materials (e.g., the one or more fill materials 140). In yet another example, the method for making the bulk nanostructure 110 includes, after the processes (a) through (f), a process for roughening sidewalls of the multiple nano-ribbons as shown in FIG. 5. In yet another example, the method for making the bulk nanostructure 110 includes, after the processes (a) through (f), a process for forming nanoholes in sidewalls through the multiple nano-ribbons as shown in FIG. 6. In yet another example, the method for making the bulk nanostructure 110 includes, after the processes (a) through (f), a process for roughening sidewalls of the multiple nano-ribbons as shown in FIG. 5, and then a process for forming nanoholes in sidewalls through the multiple nano-ribbons as shown in FIG. 6.

FIG. 5 is a simplified diagram showing a process for roughening sidewalls of the multiple nano-ribbons as a part of the method for making the bulk nanostructure 110 as shown in FIG. 1, FIG. 2, FIG. 3A, FIG. 3B, FIG. 3C, FIG. 3D, FIG. 3E, and/or FIG. 3F according to some embodiments of the present invention. This diagram is merely an example, which should not unduly limit the scope of the claims. One of ordinary skill in the art would recognize many variations, alternatives, and modifications.

As shown in FIG. 5, each of the multiple nano-ribbons 450 includes one or more sidewalls 510, and the one or more sidewalls 510 are roughened. For example, the roughened sidewalls 510 of the multiple nano-ribbons 450 are provided by one or more etching processes (e.g., one or more silicon etching processes) using chemical wet etching and/or metal catalyzed etching. In another example, the roughened sidewalls 510 of the multiple nano-ribbons 450 are formed using electrolytic etching with impressed electrical current as well as HF solution and one or more oxidizers. In yet another example, the roughened sidewalls 510 of the multiple nano-ribbons 450 are formed by depositing either silicon or silicon germanium particles using chemical vapor deposition, physical vapor deposition, and/or atomic layer deposition. In yet another example, the roughened sidewalls 510 of the multiple nano-ribbons 450 are formed by in-situ thermal growth of a film (e.g., a silicon nitride film) partially over the sidewalls 510 with desired nano-roughness for each of the multiple nano-ribbons 450.

In one embodiment, the resulting surface roughness is in nanometer scale and smaller than the thickness 454 of the corresponding nano-ribbon 450. In another embodiment, the resulting surface roughness added to each sidewall further contributes to the reduction of thermal conductivity across the bulk nanostructure 110. In yet another embodiment, throughout the sidewalls 510 for all the multiple nano-ribbons 450, multiple trenches and/or bumps in nanometer scale are formed, causing enhanced phonon scattering and reduced thermal conduction through the bulk nanostructure 110. In yet another example, the multiple nano-ribbons 450 are parts of a thermoelectric device. In yet another example, the multiple nano-ribbons 450 are the multiple nano-ribbons 130 as shown in FIG. 1, FIG. 2, FIG. 3A, FIG. 3B, FIG. 3C, FIG. 3D, FIG. 3E, and/or FIG. 3F.

As discussed above and further emphasized here, FIG. 5 is merely an example, which should not unduly limit the scope of the claims. One of ordinary skill in the art would recognize many variations, alternatives, and modifications. For example, the method for making the bulk nanostructure 110 includes, after the process for roughening sidewalls of the multiple nano-ribbons as shown in FIG. 5, a process for filling the one or more voids (e.g., one or more separate regions) between the multiple nano-ribbons 450 with one or more fill materials (e.g., the one or more fill materials 140).

FIG. 6 is a simplified diagram showing a process for forming nanoholes in sidewalls through the multiple nano-ribbons as a part of the method for making the bulk nanostructure 110 as shown in FIG. 1, FIG. 2, FIG. 3A, FIG. 3B, FIG. 3C, FIG. 3D, FIG. 3E, and/or FIG. 3F according to some embodiments of the present invention. This diagram is merely an example, which should not unduly limit the scope of the claims. One of ordinary skill in the art would recognize many variations, alternatives, and modifications.

As shown in FIG. 6, each of the multiple nano-ribbons 450 includes one or more sidewalls 510, and in each of the one or more sidewalls 510, multiple nanoholes 610 are generated through the corresponding nano-ribbons 450. In one embodiment, with the multiple nanoholes 610, the substrate 400 (e.g., a nonporous semiconductor substrate) becomes a porous substrate (e.g., a porous semiconductor substrate). For example, some or all of the nano-ribbons 450 are connected to each other throughout a bulk sized dimension (e.g., one or more remaining portions of the substrate 400), making the porous structure (e.g., the porous semiconductor substrate), although being porous in nanometer scale, to retain a strong mechanical stiffness. In another embodiment, each of the nanoholes 610 corresponds to a cross-sectional area associated with a distance across, and the distance across ranges from 5 nm to 500 nm. In yet another embodiment, in each of the one or more sidewalls 510, each nanohole 610 is separated from at least another nanohole 610 by a distance ranging from 5 nm to 500 nm.

Figure 7A:
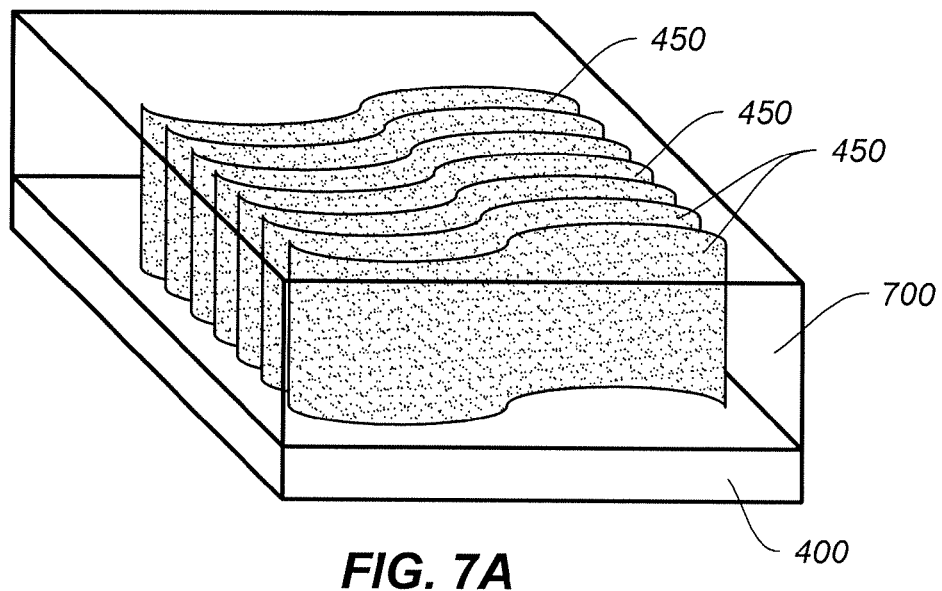
FIGS. 7A-7B are simplified diagrams showing a process for filling voids of a bulk nano-structure that includes the nano-ribbons with a block copolymer material as a part of the method for making the bulk nanostructure as shown in FIG. 1, FIG. 2, FIG. 3A, FIG. 3B, FIG. 3C, FIG. 3D, FIG. 3E, and/or FIG. 3F according to some embodiments of the present invention.
Figure 7B:
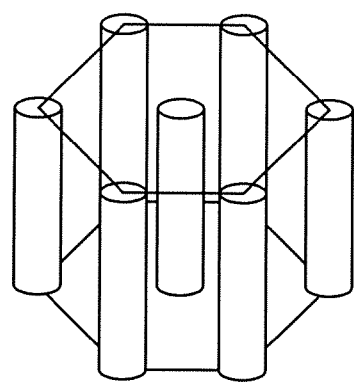
Figure 8A:
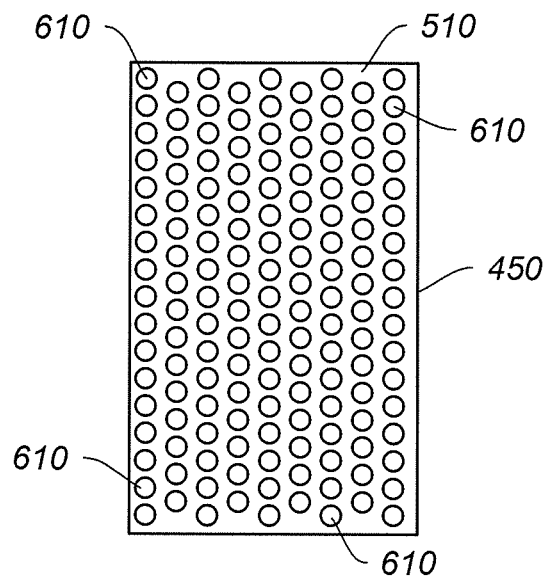
FIGS. 8A-8B are simplified diagrams showing a process for etching the nano-ribbons to form nanoholes in the sidewalls through the nano-ribbons as a part of the method for making the bulk nanostructure as shown in FIG. 1, FIG. 2, FIG. 3A, FIG. 3B, FIG. 3C, FIG. 3D, FIG. 3E, and/or FIG. 3F according to some embodiments of the present invention.
Figure 8B:
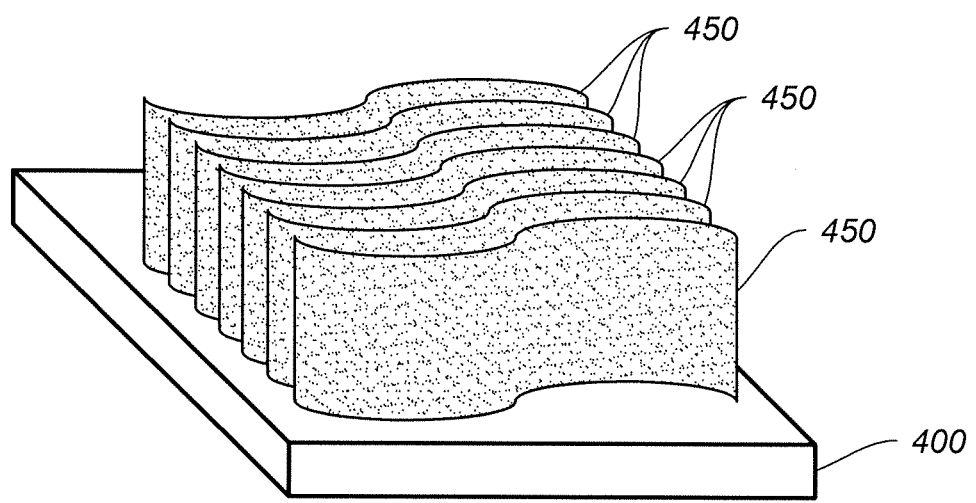

In yet another embodiment, the process for forming nanoholes in sidewalls through the multiple nano-ribbons includes the following sequential processes (i) through (ii):
  (i) filling voids of a bulk nano-structure that includes the nano-ribbons with a block copolymer material and remove portions of the block copolymer material but leaving the silver particles on the sidewalls 510 (e.g., as shown in FIGS. 7A and 7B);
  (ii) etching the nano-ribbons to form nanoholes in the sidewalls through the nano-ribbons (e.g., as shown in FIGS. 8A and 8B).

The process for forming nanoholes in sidewalls through the multiple nano-ribbons as described above is merely an example, which should not unduly limit the scope of the claims. One of ordinary skill in the art would recognize many variations, alternatives, and modifications. For example, the method for making the bulk nanostructure 110 includes, after the process for forming nanoholes in sidewalls through the multiple nano-ribbons as shown in FIG. 6, a process for filling the one or more voids (e.g., one or more separate regions) between the multiple nano-ribbons 450 with one or more fill materials (e.g., the one or more fill materials 140). In another example, the multiple nano-ribbons 450 are parts of a thermoelectric device. In yet another example, the multiple nano-ribbons 450 are the multiple nano-ribbons 130 as shown in FIG. 1, FIG. 2, FIG. 3A, FIG. 3B, FIG. 3C, FIG. 3D, FIG. 3E, and/or FIG. 3F.

FIGS. 7A-7B are simplified diagrams showing a process for filling voids of a bulk nano-structure that includes the nano-ribbons 450 with a block copolymer material as a part of the method for making the bulk nanostructure 110 as shown in FIG. 1, FIG. 2, FIG. 3A, FIG. 3B, FIG. 3C, FIG. 3D, FIG. 3E, and/or FIG. 3F according to some embodiments of the present invention. These diagrams are merely examples, which should not unduly limit the scope of the claims. One of ordinary skill in the art would recognize many variations, alternatives, and modifications.

As shown in FIG. 7A, the voids of a bulk nano-structure that includes the nano-ribbons 450 are filled with a block copolymer material. For example, the block copolymer material covers the sidewalls 510 of the nano-ribbons 450. In another example, the block copolymer material is selected to produce a cylinder morphology with one monomer phase being impregnated with silver element from $AgNO_3$ as shown in FIG. 7B, but another monomer phase of the block copolymer material contains no silver element. Afterwards, the monomer phase of the block copolymer material that contains no silver element is removed by a properly selected solvent. Then, the remaining portions of the block copolymer material is annealed in order to eliminate the non-metal components but leaving silver particles in nanometer scale on the sidewalls 510 of the nano-ribbons 450 according to one embodiment. For example, the silver particles are disposed substantially uniformly throughout each of the sidewalls 510 (e.g., with hexagonal distribution on each of the sidewalls 510).

FIGS. 8A-8B are simplified diagrams showing a process for etching the nano-ribbons to form nanoholes in the sidewalls through the nano-ribbons as a part of the method for making the bulk nanostructure 110 as shown in FIG. 1, FIG. 2, FIG. 3A, FIG. 3B, FIG. 3C, FIG. 3D, FIG. 3E, and/or FIG. 3F according to some embodiments of the present invention. These diagrams are merely examples, which should not unduly limit the scope of the claims. One of ordinary skill in the art would recognize many variations, alternatives, and modifications.

As shown in FIG. 8A, after the non-metal components of the block copolymer material is removed with silver particles in nanometer scale being left on the sidewalls 510, an etchant solution including HF and oxidizer is used to electrolessly etch the nano-ribbons 450 from the corresponding sidewalls 510, catalyzed by the silver particles, in order to form the multiple nanoholes 610 through the nano-ribbons 450. For example, the nano-ribbons 450 having the nanoholes 610 (e.g., the nanoholes in tens of nanometers) stand alone on the remaining portion of the substrate 400, as shown in FIG. 8B. In another example, the multiple nano-ribbons 450 with the nanoholes 610 form parts of a bulk nano-porous structure characterized by a ribbon thickness and a sidewall separation both in the nanometer scale (e.g., in the order of 100 nanometers or greater) and further characterized by the nanoholes also in the nanometer scale (e.g., in the order of tens of nanometers) through the nano-ribbons 450.

In yet another embodiment, the process for forming nanoholes in sidewalls through the multiple nano-ribbons is performed using a wet etching process based on an etchant including $AgNO_3$ and HF. For example, a diluted $AgNO_3$ solution is used. In yet another embodiment, the process for forming nanoholes in sidewalls through the multiple nano-ribbons is performed using wet chemical etching assisted by metal particles other than silver particles. For example, copper particles and/or cobalt particles are used to replace silver particles, and the copper particles and/or cobalt particles can help to form more dispersed nano-particles in the sidewalls 510 than the silver particles. In another example, the wet chemical etching can automatically accomplish desired size and desired spacing of metal particles (e.g., copper particles and/or cobalt particles) for etching the nanoholes 610 at corresponding locations within the sidewalls 510 of the nano-ribbons 450.

According to certain embodiments, the method for making the bulk nanostructure is simple and inexpensive. According to some embodiments, the method for making the bulk nanostructure is easily scalable. According to some embodiment, the bulk nanostructure (e.g., the bulk nano-ribbon structure and/or the nano-porous structure) has very low thermal conductivity that is nearly approaching to the amorphous limit of a bulk material in the same macroscopic size. For example, the bulk nanostructure (e.g., the bulk nano-ribbon structure and/or the nano-porous structure) starts from a flat top region of a bulk semiconductor substrate and ends at a relatively flat bottom region on the remaining portion of the substrate. In another example, the nano-ribbons are configured to be substantially interconnected, greatly enhancing mechanical stiffness of the whole bulk nano-structure (e.g., the bulk nano-ribbon structure and/or the nano-porous structure) having about 500 μm in height comparing to arrays of individually standing nanowires in the similar height. In yet another example, the bottom region of the bulk nano-structure (e.g., the bulk nano-ribbon structure and/or the nano-porous structure) is further polished in order to form a common electrical contact that is coupled to all of the nano-ribbons. Such process can simplify fabrication of the thermoelectric device element (e.g., as shown in FIG. 1) and/or fabrication of a thermoelectric device with greatly enhanced large-volume manufacturability, according to some embodiments.

Certain embodiments of the present invention provide a bulk nanostructure comprising a plurality of shaped ribbons vertically formed into a semiconductor substrate and laterally extended to any dimension up to the size of the semiconductor substrate. The plurality of shaped ribbons is characterized by a two-dimensional cross-sectional pattern featuring a ribbon thickness of 1000 nm or less and a pitch spacing ranging from 100 nm to 20000 nm and a substantially uniform height (or depth) exceeding 10 micrometers between a top region and a bottom region. The top region corresponds to a starting surface of the semiconductor substrate. The bottom region corresponds to end regions of all shaped ribbons that are rooted at remaining portion of the semiconductor substrate. For example, the two-dimensional cross-sectional pattern of the plurality of shaped ribbons is one selected from, but not limited to, substantially a brain coral pattern, a honeycomb pattern, a Sierpinsky Curve pattern, a Hilbert Curve pattern, and a fractal pattern. In another example, the plurality of shaped ribbons is formed as parallel arrays of strait or curved fins. In yet another example, the plurality of shaped ribbons is formed as interconnected fins.

In one embodiment, the bulk nanostructure is characterized by nano-scale roughness throughout surfaces of the shaped ribbons so that the effective surface area is substantially enlarged. For example, trenches and/or bumps having about a few tens of nanometers in depths or heights are formed across surfaces of the shaped ribbons. In another embodiment, a plurality of nanometer-scaled holes with certain level of porosity (e.g., ranging from about 30% to 90%) distribute (e.g., randomly distribute) within each of the plurality of the shaped ribbons, effectively enlarging the surface area of the nano-porous structure as the bulk nanostructure.

Some embodiments of the present invention provide a method for forming a bulk nanostructure (e.g., a bulk nano-ribbon structure, a bulk nano-ribbon structure) that includes a plurality of ribbons vertically arranged in a predetermined pattern with a bulk-like lateral dimension and a height greater than 10 μm on a semiconductor substrate. In one embodiment, the plurality of ribbons is characterized by a group of fin structures with a wall thickness of about 1000 nm or less, a pitch distance ranging from about 100 nm to 20000 nm between neighboring fins, and a plurality of porous structural elements with nanometer-scaled feature sizes distributed throughout each fin.

According to certain embodiments, the method includes preparing the semiconductor substrate (e.g., a silicon wafer) by coating a silicon carbide film overlying the surface of the substrate. Furthermore, the method includes applying a patterning material overlying the silicon carbide film based on the predetermined nano-scale pattern. For example, the predetermined nano-scale pattern is a pattern having its boundary length maximized or at least substantially enlarged in nanometer scale. In another example, the pattern is a brain coral structure with a feature thickness of 1000 nm or less and a pitch distance ranging from about 100 nm to 20000 nm distributed (e.g., uniformly distributed) across a bulk-sized lateral dimension ranging from a few millimeters to up to the whole surface of the substrate. In yet another example, the patterning material can be a block copolymer with roughly 50/50 dual-phase mixture. One of the dual phases can be easily removed by performing a chemical wet process to expose the silicon carbide mask film under the removed phase portions of the copolymer (e.g., exposing the silicon carbide mask film according to the brain coral structure), with the other of the dual phases remaining on the silicon carbide mask film. Additionally, the method includes performing plasma etching to further remove the exposed portions of the silicon carbide film under the removed phase portions of the copolymer, with other portions of the silicon carbide film still covered by the other phase portions of the copolymer, exposing only corresponding portions of the semiconductor substrate.

In another embodiment, the method further includes etching the semiconductor material (e.g., silicon) into the semiconductor substrate under the exposed portions of the semiconductor substrate. For example, the electroless metal-assisted chemical etching is used to remove the semiconductor material uni-directionally down to a depth into the semiconductor substrate. In another example, the depth can be greater than 10 µm. In another example, the depth is greater than 200 µm, or greater than 400 µm, or greater than 500 µm, or up to the total thickness of the semiconductor substrate. In yet another embodiment, the remaining portions of the semiconductor substrate covered by the remaining portions of the silicon carbide film form a plurality of ribbons bearing the predetermined nano-scale pattern. For example, the lateral dimension of the remaining portions of the semiconductor substrate after etching determines the ribbon thickness. In another example, the height or depth of the remaining portions of the semiconductor substrate after etching determines the height of the bulk nanostructure. In yet another example, the nano-ribbons are organized according to a brain coral pattern with nano-scale ribbon thickness (e.g., 1000 nm or less) and pitch distance (e.g., ranging from about 100 nm to 200 nm). In yet another example, the overall lateral spatial range of the pattern can be any specified bulk-size up to the whole substrate dimension (e.g., the whole wafer dimension).

In yet another embodiment, the method further includes a post-roughening process to create a plurality of trench and/or bump features throughout sidewalls of the plurality of ribbons. For example, the trench and/or bump features (e.g., about a few tens of nanometers or greater in their feature sizes and spacing) are formed by one or more techniques that are selected from etching with $H_2O_2$ and HF, metal-catalyzed etching, electrolytic etching, silicon or silicon/germanium deposition, atomic layer deposition, and in-situ silicon nitride thermal growth. In yet another embodiment, the method includes a post-holing process to create a plurality of holes partially or completely penetrating the ribbon thickness of the plurality of ribbons. For example, the plurality of holes (e.g., about a few tens of nanometers in diameters) distributed with a pitch distance (e.g., less than 100 nm) throughout the whole sidewall area of each ribbon can be formed by using a block copolymer hole patterning and a subsequent two-step etching process. In another example, the two-step etching process includes a first step to remove non-metal-containing phase of the copolymer using a selected solvent and to deposit the metal particles to the sidewalls of ribbons that are distributed according to a morphology pre-determined by the copolymer composition. In yet another example, the second step is to perform chemical etching that is assisted by the deposited metal particles on the sidewalls of the ribbons to cause holes formation in lateral directions partially or completely through the ribbon thickness. In yet another example, the metal material used in the above metal-assisted chemical etching is chosen from Ag, Au, or Co. Since the lateral dimension of the plurality of ribbons can have any bulk size ranging from a few millimeters up to the whole substrate dimension (e.g., the whole wafer dimension), a bulk nanostructure structure is formed by either the roughened ribbons (e.g., as parts of the bulk nano-ribbon structure) or the ribbons with nanoholes in sidewalls (e.g., as parts of the bulk nano-porous structure).

According to some embodiments, a nanostructure (e.g., a nano-ribbon structure, a nano-porous structure) with bulk dimensions are provided. For example, the nanostructure includes a plurality of ribbons arranged in a pattern with feature dimensions and separations in nanometer scales and each ribbon further being configured to bear nanometer surface roughness on its one or more sidewalls and/or nanometer-sized holes in its one or more sidewalls. In another example, the plurality of ribbons is formed substantially vertically into a bulk substrate in one or more of various patterns with substantial large surface areas. In yet another example, a method for forming such bulk nanostructure is provided. In yet another example, the bulk nanostructure has very low thermal conductivity and strong mechanical stiffness for fabricating high performance thermoelectric elements and corresponding devices.

According to yet another embodiment, a structure including nano-ribbons include multiple nano-ribbons. Each of the multiple nano-ribbons corresponds to a first end and a second end, and the first end and the second end are separated by a first distance of at least 100 µm. Each of the multiple nano-ribbons corresponds to a cross-sectional area associated with a ribbon thickness, and the ribbon thickness ranges from 5 nm to 500 nm. Each of the multiple nano-ribbons is separated from at least another nano-ribbon selected from the multiple nano-ribbons by a second distance ranging from 5 nm to 500 nm. For example, the structure is implemented according to at least FIG. 1, FIG. 2, FIG. 3A, FIG. 3B, FIG. 3C, FIG. 3D, FIG. 3E, and/or FIG. 3F.

In another example, each of the multiple nano-ribbons includes one or more semiconductor materials. In yet another example, the one or more semiconductor materials are doped. In yet another example, the one or more semiconductor materials are silicon. In yet another example, each of the multiple nano-ribbons is separated from at least another nano-ribbon selected from the multiple nano-ribbons by one or more separation regions associated with the second distance. In yet another example, the one or more separation regions are filled with one or more fill materials. In yet another example, each of the multiple nano-ribbons includes one or more semiconductor materials different from the one or more fill materials. In yet another example, all of the multiple nano-ribbons are substantially parallel to each other. In yet another example, each of the multiple nano-ribbons corresponds to the first end at a first surface and is substantially perpendicular to the first surface. In yet another example, the cross-sectional area is substantially uniform along a height direction for each of the multiple nano-ribbons. In yet another example, the multiple nano-ribbons are parts of a thermoelectric device. In yet another example, the first distance is at least 250 µm. In yet another example, the first distance is at least 400 µm. In yet another example, the first distance is at least 500 µm. In yet another example, the multiple nano-ribbons include multiple roughened sidewall surfaces respectively. In yet another example, the multiple nano-ribbons include multiple nanoholes through corresponding nano-ribbons in corresponding sidewalls respectively. In yet another example, the multiple nano-ribbons further include multiple roughened sidewall surfaces respectively.

According to yet another embodiment, a structure including one or more nano-ribbons includes a nano-ribbon including multiple nano-ribbon parts. Each of the multiple nano-ribbon parts corresponding to a first end and a second end, and the first end and the second end are separated by a first distance of at least 100 µm. Each of the multiple nano-ribbon parts corresponds to a cross-sectional area associated with a thickness, and the thickness ranging from 5 nm to 500 nm. Each of the multiple nano-ribbon parts is separated from at least another nano-ribbon part selected from the multiple nano-ribbon parts by a second distance ranging from 5 nm to 500 nm. For example, the structure is implemented according to at least FIG. 1, FIG. 2, FIG. 3A, FIG. 3B, FIG. 3C, FIG. 3D, FIG. 3E, and/or FIG. 3F.

In another example, each of the multiple nano-ribbon parts includes one or more semiconductor materials. In yet another example, the one or more semiconductor materials are doped. In yet another example, the one or more semiconductor materials are silicon. In yet another example, each of the multiple nano-ribbon parts is separated from at least another nano-ribbon part selected from the multiple nano-ribbon parts by one or more separation regions associated with the second distance. In yet another example, the one or more separation regions are filled with one or more fill materials. In yet another example, each of the multiple nano-ribbon parts includes one or more semiconductor materials different from the one or more fill materials. In yet another example, all of the multiple nano-ribbon parts are substantially parallel to each other. In yet another example, each of the multiple nano-ribbon parts corresponds to the first end at a first surface and is substantially perpendicular to the first surface. In yet another example, the cross-sectional area is substantially uniform along a height direction for each of the multiple nano-ribbon parts. In yet another example, the multiple nano-ribbon parts are parts of a thermoelectric device. In yet another example, the first distance is at least 250 µm. In yet another example, the first distance is at least 400 µm. In yet another example, the first distance is at least 500 µm. In yet another example, the multiple nano-ribbon parts include multiple roughened sidewall surfaces respectively. In yet another example, the multiple nano-ribbon parts include multiple nanoholes through corresponding nano-ribbon parts in corresponding sidewalls respectively. In yet another example, the multiple nano-ribbon parts further include multiple roughened sidewall surfaces respectively.

According to yet another embodiment, a porous structure includes a porous semiconductor substrate including multiple first voids. The multiple first voids are connected with each other. Each of the multiple first voids corresponds to a first cross-sectional area associated with a first distance across, and the first distance across ranges from 5 nm to 500 nm. Each of the multiple first voids is separated from at least another void by a first distance ranging from 5 nm to 500 nm. For example, the structure is implemented according to at least FIG. 1, FIG. 2, FIG. 3A, FIG. 3B, FIG. 3C, FIG. 3D, FIG. 3E, and/or FIG. 3F.

In another example, at least one of the multiple first voids is completely surrounded by one or more solid materials of the porous semiconductor substrate. In yet another example, at least one of the multiple first voids is open to an area outside the porous semiconductor substrate. In yet another example, the porous semiconductor substrate further includes one or more second voids, each of the one or more second voids not being connected with any void. Each of the one or more second voids corresponds to a second cross-sectional area associated with a second distance across, the second distance across ranging from 5 nm to 500 nm, and each of the one or more second voids is separated from at least another void by a second distance ranging from 5 nm to 500 nm. In yet another example, the multiple voids include multiple nanoholes. In yet another example, the porous semiconductor substrate is doped. In yet another example, the porous semiconductor substrate includes silicon. In yet another example, the multiple voids are filled with one or more fill materials. In yet another example, the porous semiconductor substrate includes one or more semiconductor materials different from the one or more fill materials. In yet another example, the porous semiconductor substrate is a part of a thermoelectric device.

According to yet another embodiment, a method for making a structure including nano-ribbons includes providing a semiconductor substrate including a first surface. The first surface includes first portions and second portions. Additionally, the method includes forming one or more layers on the first portions of the first surface. The second portions of the first surface are exposed. Moreover, the method includes etching the semiconductor substrate through the second portions of the first surface to form at least multiple nano-ribbons. Each of the nano-ribbons corresponds to a first end and a second end, and the first end and the second end are separated by a first distance of at least 100 µm. Each of the nano-ribbons corresponds to a cross-sectional area associated with a ribbon thickness ranging from 5 nm to 500 nm, and each of the nano-ribbons is separated from at least another nano-ribbon selected from the multiple nano-ribbons by a second distance ranging from 5 nm to 500 nm. For example, the method is implemented according to at least FIGS. 4A-4F, FIG. 5, and/or FIG. 6.

In another example, the method further includes filling one or more separation regions between at least two of the multiple nano-ribbons with one or more fill materials. In yet another example, the semiconductor substrate includes one or more semiconductor materials different from the one or more fill materials. In yet another example, the method further includes roughening sidewalls of the multiple nano-ribbons respectively. In yet another example, the method further includes forming multiple nanoholes in corresponding sidewalls through the multiple nano-ribbons respectively. In yet another example, the method further includes roughening sidewalls of the multiple nano-ribbons respectively, and forming multiple nanoholes in the roughened sidewalls through the multiple nano-ribbons respectively. In yet another example, the process for etching the semiconductor substrate through the second portions of the first surface includes a wet etching process through the second portions of the first surface. In yet another example, the wet etching process includes an electroless chemical etching process. In yet another example, the wet etching process includes an electrolytic chemical etching process.

According to yet another embodiment, a method for making a structure including one or more nano-ribbons includes providing a semiconductor substrate including a first surface. The first surface includes first portions and second portions. Additionally, the method includes forming one or more layers on the first portions of the first surface. The second portions of the first surface are exposed. Moreover, the method includes etching the semiconductor substrate through the second portions of the first surface to form at least one nano-ribbon including multiple nano-ribbon parts. Each of the nano-ribbon parts corresponds to a first end and a second end, and the first end and the second end are separated by a first distance of at least 100 µm. Each of the nano-ribbon parts corresponds to a cross-sectional area associated with a thickness ranging from 5 nm to 500 nm. Each of the nano-ribbon parts is separated from at least another nano-ribbon part selected from the multiple nano-ribbon parts by a second distance ranging from 5 nm to 500 nm. For example, the method is implemented according to at least FIGS. 4A-4F, FIG. 5, and/or FIG. 6.

In another example, the method further includes filling one or more separation regions between at least two of the multiple nano-ribbon parts with one or more fill materials. In yet another example, the semiconductor substrate includes one or more semiconductor materials different from the one or more fill materials. In yet another example, the method further includes roughening sidewalls of the multiple nano-ribbon parts respectively. In yet another example, the method further includes forming multiple nanoholes in corresponding sidewalls through the multiple nano-ribbon parts respectively. In yet another example, the method further includes roughening sidewalls of the multiple nano-ribbon parts respectively, and forming multiple nanoholes in the roughened sidewalls through the multiple nano-ribbon parts respectively. In yet another example, the process for etching the semiconductor substrate through the second portions of the first surface includes a wet etching process through the second portions of the first surface. In yet another example, the wet etching process includes an electroless chemical etching process. In yet another example, the wet etching process includes an electrolytic chemical etching process.

According to yet another embodiment, a method for making a porous structure includes providing a nonporous semiconductor substrate including one or more surfaces. The one or more surfaces include first portions and second portions. Additionally, the method includes forming one or more layers on the first portions of the one or more surfaces. The second portions of the one or more surfaces are exposed. Moreover, the method includes etching the nonporous semiconductor substrate through the second portions of the one or more surfaces to form a porous semiconductor substrate including multiple first voids connected with each other. Each of the multiple first voids corresponds to a first cross-sectional area associated with a first distance across ranging from 5 nm to 500 nm, and each of the multiple first voids are separated from at least another void by a first distance ranging from 5 nm to 500 nm. For example, the method is implemented according to at least FIGS. 4A-4F, FIG. 5, and/or FIG. 6.

In another example, the method further includes filling the multiple first voids with one or more fill materials. In yet another example, the nonporous semiconductor substrate includes one or more semiconductor materials different from the one or more fill materials. In yet another example, the method further includes roughening sidewalls of at least some of the multiple first voids. In yet another example, the process for etching the nonporous semiconductor substrate through the second portions of the one or more surfaces is performed to form the porous semiconductor substrate, and at least one of the multiple first voids is completely surrounded by one or more solid materials of the porous semiconductor substrate. In yet another example, the process for etching the nonporous semiconductor substrate through the second portions of the one or more surfaces is performed to form the porous semiconductor substrate, and at least one of the multiple first voids is open to an area outside the porous semiconductor substrate. In yet another example, the process for etching the nonporous semiconductor substrate through the second portions of the one or more surfaces is performed to form the porous semiconductor substrate further including one or more second voids. Each of the one or more second voids are not connected with any void. Each of the one or more second voids corresponds to a second cross-sectional area associated with a second distance across ranging from 5 nm to 500 nm, and each of the one or more second voids is separated from at least another void by a second distance ranging from 5 nm to 500 nm. In yet another example, the method further includes filling the one or more second voids with one or more fill materials. In yet another example, the nonporous semiconductor substrate includes one or more semiconductor materials different from the one or more fill materials. In yet another example, the method further includes roughening sidewalls of at least some of the one or more second voids. In yet another example, the process for etching the nonporous semiconductor substrate through the second portions of the one or more surfaces includes a wet etching process through the second portions of the one or more surfaces. In yet another example, the wet etching process includes an electroless chemical etching process. In yet another example, the wet etching process includes an electrolytic chemical etching process.

Although specific embodiments of the present invention have been described, it will be understood by those of skill in the art that there are other embodiments that are equivalent to the described embodiments. For example, various embodiments and/or examples of the present invention can be combined. Accordingly, it is to be understood that the invention is not to be limited by the specific illustrated embodiments, but only by the scope of the appended claims.

What is claimed is:

1. A structure including nano-ribbons, the structure comprising:
    multiple nano-ribbons, each of the multiple nano-ribbons corresponding to a first end and a second end, the first end and the second end being separated by a first distance of at least 100 µm;
    wherein:
        each of the multiple nano-ribbons corresponds to a cross-sectional area associated with a ribbon thickness, the ribbon thickness ranging from 5 nm to 500 nm; and
        each of the multiple nano-ribbons is separated from at least another nano-ribbon selected from the multiple nano-ribbons by a second distance ranging from 5 nm to 500 nm.

2. The structure of claim 1 wherein each of the multiple nano-ribbons includes one or more semiconductor materials.

3. The structure of claim 2 wherein the one or more semiconductor materials are doped.

4. The structure of claim 2 wherein the one or more semiconductor materials are silicon.

5. The structure of claim 1 wherein each of the multiple nano-ribbons is separated from at least another nano-ribbon selected from the multiple nano-ribbons by one or more separation regions associated with the second distance.

6. The structure of claim 5 wherein the one or more separation regions are filled with one or more fill materials.

7. The structure of claim 6 wherein each of the multiple nano-ribbons includes one or more semiconductor materials different from the one or more fill materials.

8. The structure of claim 1 wherein all of the multiple nano-ribbons are substantially parallel to each other.

9. The structure of claim 8 wherein each of the multiple nano-ribbons corresponds to the first end at a first surface and is substantially perpendicular to the first surface.

10. The structure of claim 1 wherein the cross-sectional area is substantially uniform along a height direction for each of the multiple nano-ribbons.

11. The structure of claim 1 wherein the multiple nano-ribbons are parts of a thermoelectric device.

12. The structure of claim 1 wherein the first distance is at least 250 µm.

13. The structure of claim 12 wherein the first distance is at least 400 µm.

14. The structure of claim 13 wherein the first distance is at least 500 μm.

15. The structure of claim 1 wherein the multiple nano-ribbons include multiple roughened sidewall surfaces respectively.

16. The structure of claim 1 wherein the multiple nano-ribbons include multiple nanoholes through corresponding nano-ribbons in corresponding sidewalls respectively.

17. The structure of claim 16 wherein the multiple nano-ribbons further include multiple roughened sidewall surfaces respectively.

18. A structure including one or more nano-ribbons, the structure comprising:
a nano-ribbon including multiple nano-ribbon parts, each of the multiple nano-ribbon parts corresponding to a first end and a second end, the first end and the second end being separated by a first distance of at least 100 μm;
wherein:
each of the multiple nano-ribbon parts corresponds to a cross-sectional area associated with a thickness, the thickness ranging from 5 nm to 500 nm; and
each of the multiple nano-ribbon parts is separated from at least another nano-ribbon part selected from the multiple nano-ribbon parts by a second distance ranging from 5 nm to 500 nm.

19. The structure of claim 18 wherein each of the multiple nano-ribbon parts includes one or more semiconductor materials.

20. The structure of claim 19 wherein the one or more semiconductor materials are doped.

21. The structure of claim 19 wherein the one or more semiconductor materials are silicon.

22. The structure of claim 18 wherein each of the multiple nano-ribbon parts is separated from at least another nano-ribbon part selected from the multiple nano-ribbon parts by one or more separation regions associated with the second distance.

23. The structure of claim 22 wherein the one or more separation regions are filled with one or more fill materials.

24. The structure of claim 23 wherein each of the multiple nano-ribbon parts includes one or more semiconductor materials different from the one or more fill materials.

25. The structure of claim 18 wherein all of the multiple nano-ribbon parts are substantially parallel to each other.

26. The structure of claim 25 wherein each of the multiple nano-ribbon parts corresponds to the first end at a first surface and is substantially perpendicular to the first surface.

27. The structure of claim 18 wherein the cross-sectional area is substantially uniform along a height direction for each of the multiple nano-ribbon parts.

28. The structure of claim 18 wherein the multiple nano-ribbon parts are parts of a thermoelectric device.

29. The structure of claim 18 wherein the first distance is at least 250 μm.

30. The structure of claim 29 wherein the first distance is at least 400 μm.

31. The structure of claim 30 wherein the first distance is at least 500 μm.

32. The structure of claim 18 wherein the multiple nano-ribbon parts include multiple roughened sidewall surfaces respectively.

33. The structure of claim 18 wherein the multiple nano-ribbon parts include multiple nanoholes through corresponding nano-ribbon parts in corresponding sidewalls respectively.

34. The structure of claim 33 wherein the multiple nano-ribbon parts further include multiple roughened sidewall surfaces respectively.

35. A porous structure, the structure comprising:
a porous semiconductor substrate including multiple first voids, the multiple first voids being connected with each other;
wherein:
each of the multiple first voids corresponds to a first cross-sectional area associated with a first distance across, the first distance across ranging from 5 nm to 500 nm; and
each of the multiple first voids is separated from at least another void by a first distance ranging from 5 nm to 500 nm.

36. The porous structure of claim 35 wherein at least one of the multiple first voids is completely surrounded by one or more solid materials of the porous semiconductor substrate.

37. The porous structure of claim 35 wherein at least one of the multiple first voids is open to an area outside the porous semiconductor substrate.

38. The porous structure of claim 35 wherein:
the porous semiconductor substrate further includes one or more second voids, each of the one or more second voids not being connected with any void;
wherein:
each of the one or more second voids corresponds to a second cross-sectional area associated with a second distance across, the second distance across ranging from 5 nm to 500 nm; and
each of the one or more second voids is separated from at least another void by a second distance ranging from 5 nm to 500 nm.

39. The porous structure of claim 35 wherein the multiple first voids include multiple nanoholes.

40. The porous structure of claim 35 wherein the porous semiconductor substrate is doped.

41. The porous structure of claim 35 wherein the porous semiconductor substrate includes silicon.

42. The porous structure of claim 35 wherein the multiple first voids are filled with one or more fill materials.

43. The porous structure of claim 42 wherein the porous semiconductor substrate includes one or more semiconductor materials different from the one or more fill materials.

44. The porous structure of claim 35 wherein the porous semiconductor substrate is a part of a thermoelectric device.

* * * * *